United States Patent
Kao et al.

(10) Patent No.: US 10,381,300 B2
(45) Date of Patent: Aug. 13, 2019

(54) SEMICONDUCTOR DEVICE PACKAGE INCLUDING FILLING MOLD VIA

(71) Applicant: Advanced Semiconductor Engineering, Inc., Kaohsiung (TW)

(72) Inventors: Jen-Chieh Kao, Kaohsiung (TW); Chang-Lin Yeh, Kaohsiung (TW); Yi Chen, Kaohsiung (TW); Sung-Hung Chiang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/362,548

(22) Filed: Nov. 28, 2016

(65) Prior Publication Data
US 2018/0151485 A1    May 31, 2018

(51) Int. Cl.
| | |
|---|---|
| H01L 23/498 | (2006.01) |
| H01L 21/48 | (2006.01) |
| H01L 23/02 | (2006.01) |
| H01L 23/00 | (2006.01) |
| H01L 23/552 | (2006.01) |
| H01L 23/31 | (2006.01) |
| H01L 23/538 | (2006.01) |

(52) U.S. Cl.
CPC ...... *H01L 23/49838* (2013.01); *H01L 21/486* (2013.01); *H01L 23/02* (2013.01); *H01L 23/49827* (2013.01); *H01L 23/552* (2013.01); *H01L 24/06* (2013.01); *H01L 23/3121* (2013.01); *H01L 23/5383* (2013.01); *H01L 2224/16227* (2013.01); *H01L 2924/15311* (2013.01); *H01L 2924/1815* (2013.01); *H01L 2924/19105* (2013.01)

(58) Field of Classification Search
CPC ......... H01L 23/49838; H01L 23/49827; H01L 23/552; H01L 23/3121; H01L 21/486
See application file for complete search history.

(56) References Cited

U.S. PATENT DOCUMENTS

| | | | | |
|---|---|---|---|---|
| 5,990,545 | A * | 11/1999 | Schueller | H01L 23/3121 257/678 |
| 9,654,004 | B1 * | 5/2017 | Deligianni | H02M 3/158 |
| 2003/0141596 | A1 * | 7/2003 | Nakamura | H01L 21/4846 257/758 |
| 2008/0239685 | A1 * | 10/2008 | Kawabe | H01G 4/232 361/782 |
| 2009/0289362 | A1 * | 11/2009 | Rhyner | H01L 21/563 257/738 |
| 2012/0153493 | A1 * | 6/2012 | Lee | H01L 25/16 257/774 |

(Continued)

*Primary Examiner* — Nathan W Ha
(74) *Attorney, Agent, or Firm* — Foley & Lardner LLP; Cliff Z. Liu

(57) ABSTRACT

A semiconductor device package includes a substrate, a package body, a via and an interconnect. The substrate includes a surface and a pad on the first surface. The package body covers at least a portion of the surface of the substrate. The via is disposed in the package body and includes a conductive layer and a first intermediate layer. The conductive layer is electrically connected with the pad. The first intermediate layer is adjacent to the conductive layer. The interconnect is disposed on the first intermediate layer.

26 Claims, 40 Drawing Sheets

(56) References Cited

U.S. PATENT DOCUMENTS

| | | | |
|---|---|---|---|
| 2012/0326308 A1* | 12/2012 | Alvarado | H01L 24/03 257/738 |
| 2013/0075923 A1 | 3/2013 | Park et al. | |
| 2013/0234323 A1* | 9/2013 | Miyazaki | H01L 24/12 257/737 |
| 2014/0159238 A1* | 6/2014 | Aldrete | H01L 23/488 257/741 |
| 2014/0183731 A1* | 7/2014 | Lin | H01L 23/49827 257/738 |
| 2014/0231986 A1* | 8/2014 | Dubin | H01L 23/481 257/737 |
| 2015/0001708 A1* | 1/2015 | Lin | H01L 23/49811 257/737 |
| 2015/0318333 A1* | 11/2015 | Narayanan | H01L 23/53238 257/4 |
| 2015/0325508 A1* | 11/2015 | Chen | H01L 21/48 361/768 |
| 2016/0043047 A1* | 2/2016 | Shim, II | H01L 21/561 257/773 |
| 2016/0079149 A1* | 3/2016 | Yoshida | H01L 23/49822 257/774 |
| 2016/0118333 A1* | 4/2016 | Lin | H01L 24/97 257/773 |
| 2016/0163628 A1* | 6/2016 | We | H01L 23/49827 257/664 |
| 2016/0163679 A1* | 6/2016 | Mohammed | H01L 25/50 257/737 |
| 2016/0233292 A1* | 8/2016 | Chen | H01L 28/10 |
| 2016/0276248 A1* | 9/2016 | Huang | H01L 24/97 |
| 2016/0300817 A1* | 10/2016 | Do | H01L 25/50 |
| 2017/0207161 A1* | 7/2017 | Lin | H01L 23/49838 |
| 2018/0122791 A1* | 5/2018 | Liu | H01L 25/50 |

\* cited by examiner

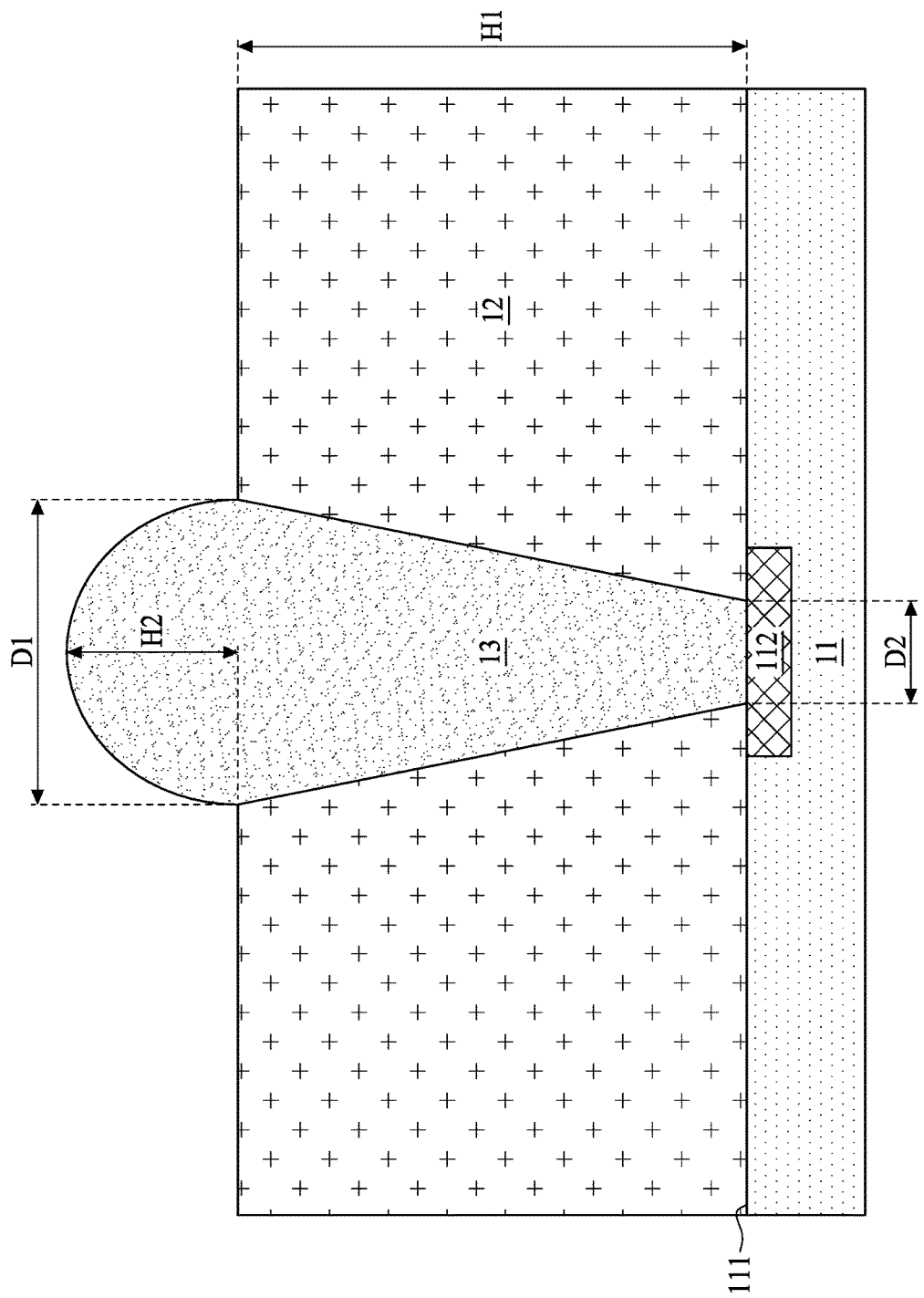

SEMICONDUCTOR DEVICE PACKAGE INCLUDING FILLING MOLD VIA

BACKGROUND

1. Technical Field

The present disclosure relates generally to a structure of filling mold vias. More particularly, the present disclosure relates to filling mold vias for retaining solder in a via hole during a reflowing process.

2. Description of the Related Art

There is continued demand for decreased size, reduced weight, improved performance, improved reliability and lower costs for electronic products, such as cell phones and wearable electronics. Accordingly, improvements such as system-on-chip (SoC) packages have been developed. SoC packages integrate multiple functionalities at the chip level; however, designing and testing SoC packages can be difficult, and SoC manufacturing can be relatively costly and low-yield. Therefore, package on package (PoP) technology is becoming increasingly popular since it allows denser integration of circuits in a small package. There is a continuing drive to develop PoP techniques.

SUMMARY

In some embodiments, a semiconductor device package includes a substrate, a package body, a via and an interconnect. The substrate includes a surface and a pad on the surface. The package body covers at least a portion of the surface of the substrate. The via is disposed in the package body and includes a conductive layer and a first intermediate layer. The conductive layer is electrically connected with the pad. The first intermediate layer is adjacent to the conductive layer. The interconnect is disposed on the first intermediate layer.

In some embodiments, a method of manufacturing a semiconductor device package includes: providing a substrate including a surface and a pad on the surface; forming a package body to cover the surface of the substrate; removing a portion of the package body to form a via hole; forming a conductive layer in the via hole to contact the pad of the substrate; forming a first intermediate layer on the conductive layer; and disposing an interconnect on the first intermediate layer.

BRIEF DESCRIPTION OF THE DRAWINGS

FIG. 9A, FIG. 9B, FIG. 9C, FIG. 9D, FIG. 9E, FIG. 9F and FIG. 9G illustrate cross-sectional views of via holes or filling mold vias in accordance with some embodiments of the present disclosure;

Figure 1:
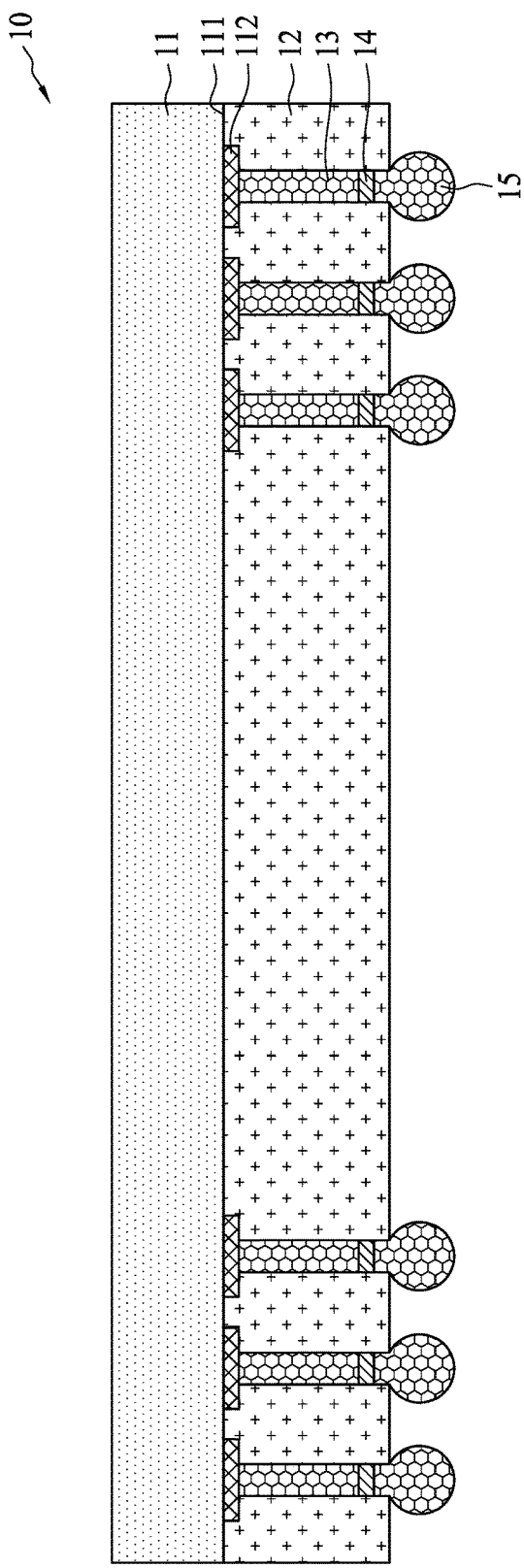
FIG. 1 illustrates a cross-sectional view of a semiconductor device package in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

In a package-in-package (PiP) or PoP structure, a filling mold via (FMV) can be used for electrical connection; however, when forming the FMV with solder, the solder melts during a surface-mount process (or other manufacturing process) because a melting point of the solder is lower than a reflow temperature (e.g., about 260° C.). If the solder melts during the surface-mount process, the solder forming the FMV may be pulled down (due to gravity) and absorbed by an underneath pad (on a system board) to form a void which may break the electrical connection between the package structure and the system board. One way to solve this problem may use a silver-containing adhesive to form the FMV; however, an adhesion between the silver-containing adhesive and a solder ball on a pad of the system board is poor.

In some embodiments, a conductive barrier layer between solder in a FMV and a solder ball may be formed. The barrier layer has a melting point higher than a reflow temperature so that it may retain the solder in a via hole. A junction layer between a silver-containing adhesive in the via hole and a solder ball may be formed to increase an adhesion between the silver-containing adhesive and the solder ball.

As used herein, relative terms, such as "inner," "interior," "outer," "exterior," "top," "bottom," "front," "back," "upper," "upwardly," "lower," "downwardly," "vertical," "vertically," "lateral," "laterally," "above," and "below," refer to an orientation of a set of components with respect to one another; this orientation is in accordance with the drawings, but is not required during manufacturing or use.

FIG. 1 illustrates a cross-sectional view of a semiconductor device package 10 in accordance with some embodiments of the present disclosure. The semiconductor device package 10 includes a substrate 11, a package body 12, at least one via and at least one interconnect 15. The substrate 11 has a first surface (e.g., a bottom surface) 111 and a pad 112 on the first surface 111. The package body 12 covers at least a portion of the first surface 111 of the substrate 11. The via is disposed in the package body 12 and includes a conductive layer 13 and a first intermediate layer 14. The conductive layer 13 is electrically connected with the pad 112. The first intermediate layer 14 is adjacent to the conductive layer 13. A melting temperature of a material of the first intermediate layer 14 is higher than a melting temperature of a material of the conductive layer 13. In some embodiments, a thickness of the first intermediate layer 14 is no greater than or less than about one percent of a thickness of the conductive layer 13, such as about 0.8 percent or less, or about 0.5 percent or less. The interconnect 15 is adjacent to the first intermediate layer 14, and the first intermediate layer 14 is interposed between the conductive layer 13 and the interconnect 15. In some embodiments, the first intermediate layer 14 comprises stainless steel, such as one designated as Steel Use Stainless (SUS), or another metal or metal alloy. In some embodiments, the melting temperature of the material of the first intermediate layer 14 is higher than about 260 degrees Celsius, such as about 300 degrees Celsius or higher, about 500 degrees Celsius or higher, about 800 degrees Celsius or higher, or about 1000 degrees Celsius or higher, and up to about 1500 degrees Celsius or higher. In some embodiments, the first intermediate layer 14 functions as a conductive barrier layer, which is a conductive solid structure after its curing, but does not melt during a reflow temperature of surface-mount technology (SMT) and has strong adhesion with tin (Sn)-based solders (e.g., tin-silver-copper (SAC) solder, tin-silver (SnAg) solder, and so forth). In some embodiments, the first intermediate layer 14 can be formed by electroless plating or sputtering copper (Cu), gold (Au), nickel (Ni), or a combination of two or more thereof. The first intermediate layer 14 can have strong adhesion to silver-containing adhesive (e.g., silver-containing epoxy) and to solder paste/ball.

As shown in FIG. 1, the interconnect 15 and the conductive layer 13 comprise a same material, such as solder. The first intermediate layer 14 retains the conductive layer 13 in the via during a surface-mount process.

The substrate 11 may be, or may include, a polymeric or a non-polymeric dielectric material. For example, the substrate 11 may include a flowable dielectric material in a hardened or semi-hardened state, such as a liquid crystal polymer, a resin with pre-impregnated fibers (e.g., a prepreg), Ajinomoto Buildup Film (ABF), a resin, an epoxy material, or other flowable dielectric material in a hardened or semi-hardened state. In some embodiments, the substrate 11 includes a single resin layer. In other embodiments, the substrate 11 includes multiple resin layers; for example, a first sub-layer formed of a resin and a second sub-layer formed of an enhanced resin (such as a resin enhanced by glass fibers or Kevlar fibers). In some embodiments, the substrate 11 includes a prepreg that may be in a single layer or multiple layers. In some embodiments, the substrate 11 includes at least one prepreg layer and at least one resin layer.

Figure 2:
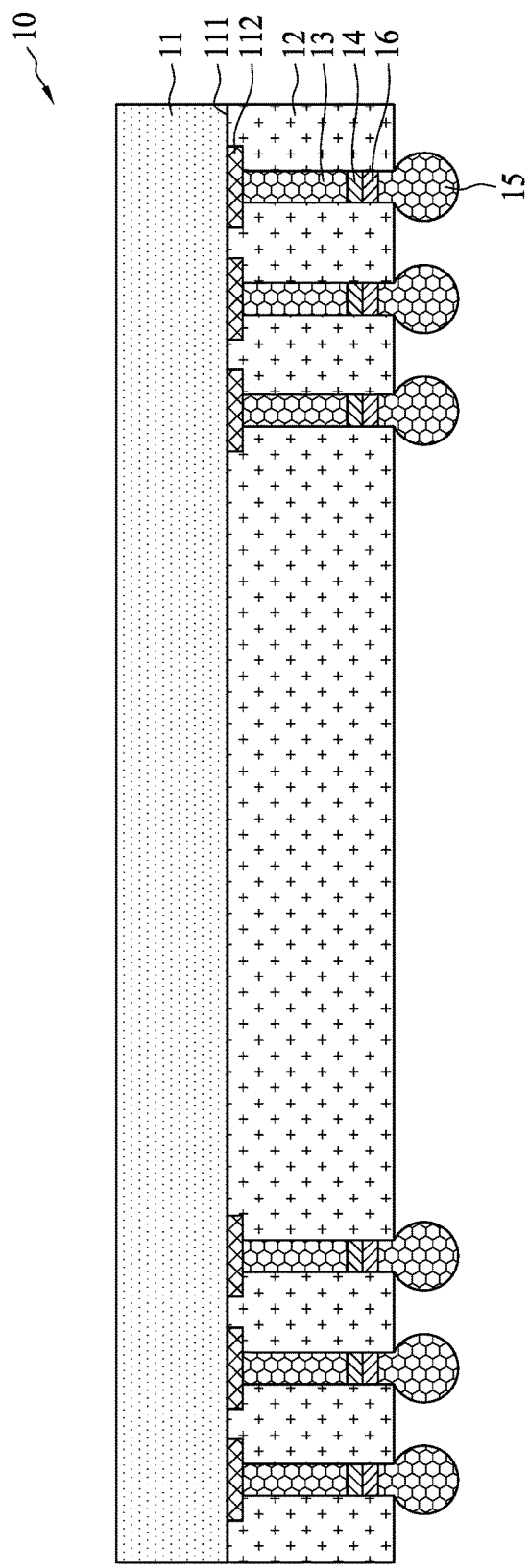
FIG. 2 illustrates a cross-sectional view of a semiconductor device package in accordance with some embodiments of the present disclosure.

FIG. 2 illustrates a cross-sectional view of a semiconductor device package 10 in accordance with some embodiments of the present disclosure. The semiconductor device package 10 shown in FIG. 2 is similar in certain respects to the semiconductor device package 10 shown in FIG. 1, except that in FIG. 2, the semiconductor device package 10 further includes a second intermediate layer 16 between the first intermediate layer 14 and the interconnect 15. The second intermediate layer 16 bonds the first intermediate layer 14 to the interconnect 15. In some embodiments, a first adhesion force between the second intermediate layer 16 and the interconnect 15 is larger than a second adhesion force between the first intermediate layer 14 and the interconnect 15. A material of the second intermediate layer 16 may be, for example, a metal or a metal alloy.

Figure 3:
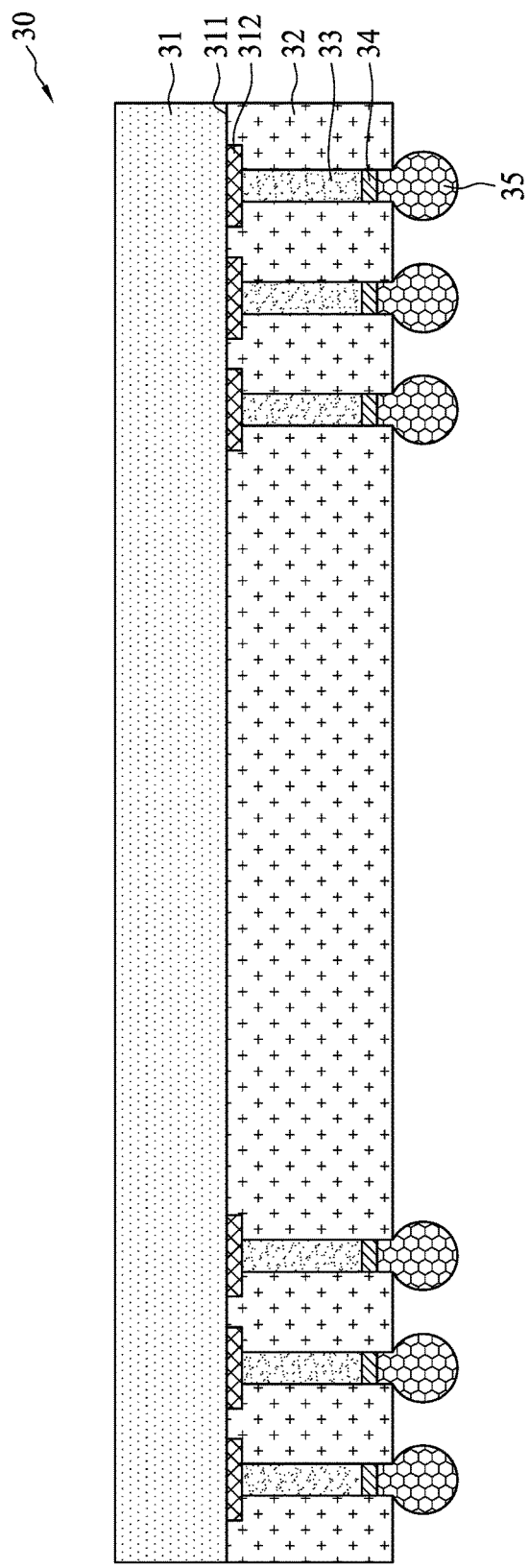
FIG. 3 illustrates a cross-sectional view of a semiconductor device package in accordance with some embodiments of the present disclosure.

FIG. 3 illustrates a cross-sectional view of a semiconductor device package 30 in accordance with some embodiments of the present disclosure. The semiconductor device package 30 includes a substrate 31, a package body 32, at least one via and at least one interconnect 35. The substrate 31 has a first surface (e.g., a bottom surface) 311 and a pad 312 on the first surface 311. The package body 32 covers at least a portion of the first surface 311 of the substrate 31. The via is disposed in the package body 32 and includes a conductive layer 33 and a first intermediate layer 34. The conductive layer 33 is electrically connected with the pad 312. The first intermediate layer 34 is adjacent to the conductive layer 33. A melting temperature of a material of the first intermediate layer 34 is higher than a melting temperature of a material of the conductive layer 33. In some embodiments, a thickness of the first intermediate layer 34 is no greater than or less than about one percent of a thickness of the conductive layer 33, such as about 0.8 percent or less, or about 0.5 percent or less. The interconnect 35 is adjacent to the first intermediate layer 34, and the first intermediate layer 34 is interposed between the conductive layer 33 and the interconnect 35. In some embodiments, the first intermediate layer 34 comprises stainless steel, such as one designated as SUS. In some embodiments, the melting temperature of the material of the first intermediate layer 34 is higher than about 260 degrees Celsius, such as about 300 degrees Celsius or higher, about 500 degrees Celsius or higher, about 800 degrees Celsius or higher, or about 1000 degrees Celsius or higher, and up to about 1500 degrees Celsius or higher. The melting temperature of the material of the first intermediate layer 34 is higher than a SMT reflow temperature.

As shown in FIG. 3, the interconnect 35 and the conductive layer 33 comprises different materials. The intermediate layer 34 retains the conductive layer 33 in the via during a surface-mount process.

Figure 4:
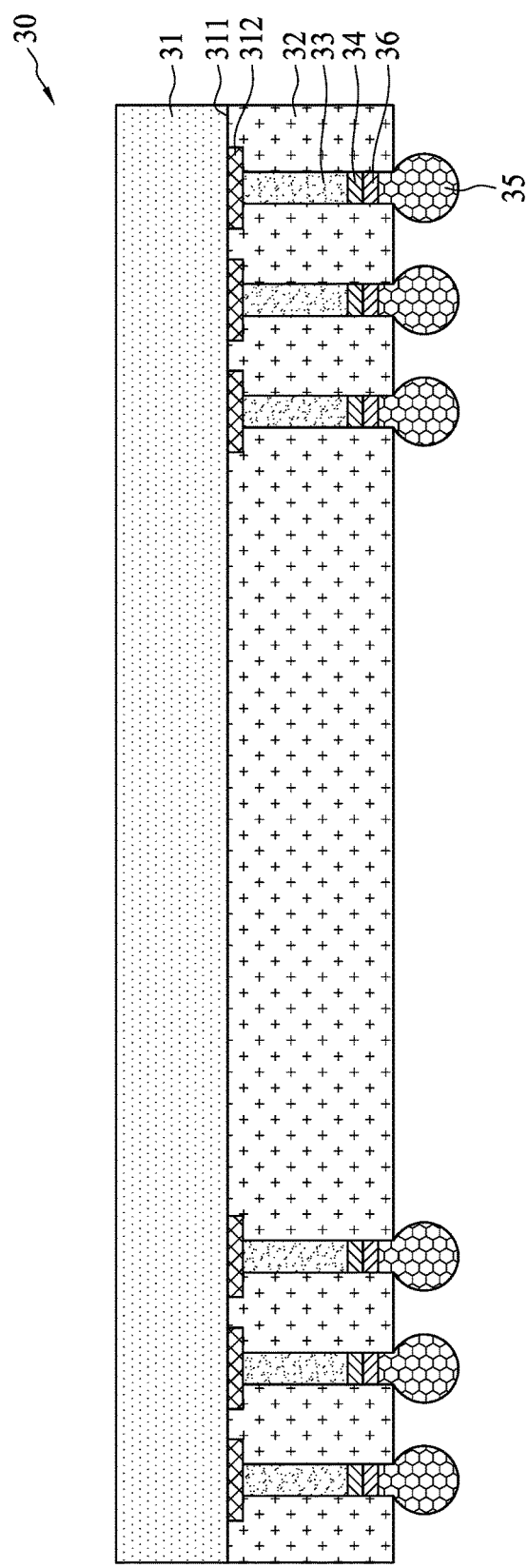
FIG. 4 illustrates a cross-sectional view of a semiconductor device package in accordance with some embodiments of the present disclosure.

FIG. 4 illustrates a cross-sectional view of a semiconductor device package 30 in accordance with some embodiments of the present disclosure. The semiconductor device package 30 shown in FIG. 4 is similar in certain respects to the semiconductor device package 30 shown in FIG. 3, except that in FIG. 4, the semiconductor device package 30 further includes a second intermediate layer 36 between the first intermediate layer 34 and the interconnect 35. The second intermediate layer 36 bonds the first intermediate layer 34 to the interconnect 35. In some embodiments, a first adhesion force between the second intermediate layer 36 and the interconnect 35 is larger than a second adhesion force between the first intermediate layer 34 and the interconnect 35.

Figure 5:
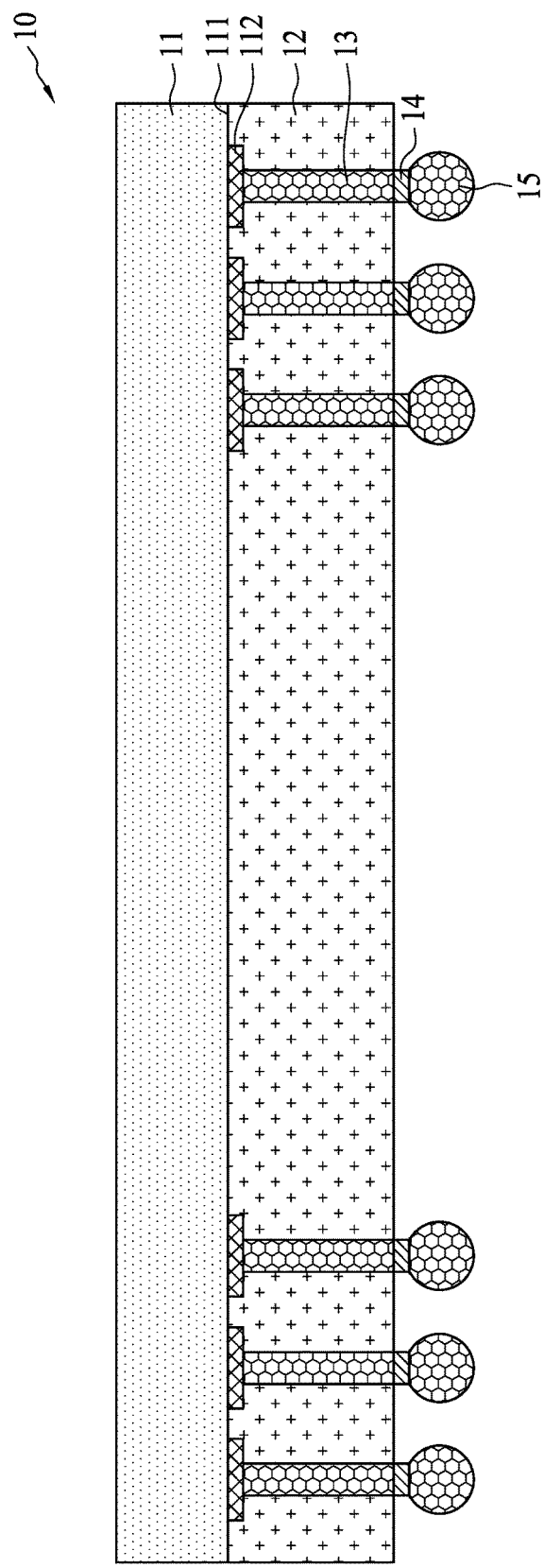
FIG. 5 illustrates a cross-sectional view of a semiconductor device package in accordance with some embodiments of the present disclosure.

FIG. 5 illustrates a cross-sectional view of a semiconductor device package 10 in accordance with some embodiments of the present disclosure. The semiconductor device package 10 shown in FIG. 5 is similar in certain respects to the semiconductor device package 10 shown in FIG. 1, except that in FIG. 5, the first intermediate layer 14 extends out of or protrudes from the package body 12, instead of being recessed from a bottom surface of the package body 12.

Figure 6:
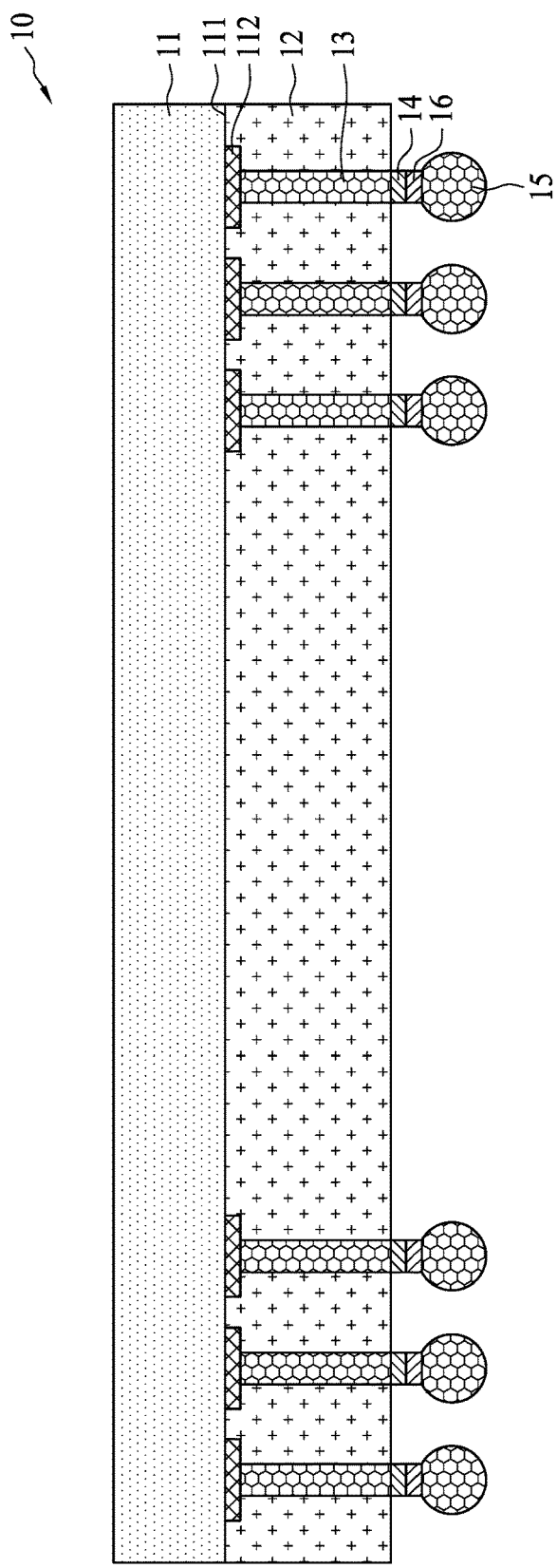
FIG. 6 illustrates a cross-sectional view of a semiconductor device package in accordance with some embodiments of the present disclosure.

FIG. 6 illustrates a cross-sectional view of a semiconductor device package 10 in accordance with some embodiments of the present disclosure. The semiconductor device package 10 shown in FIG. 6 is similar in certain respects to the semiconductor device package 10 shown in FIG. 2, except that in FIG. 6, the first intermediate layer 14 and the second intermediate layer 16 extends out of or protrudes from the package body 12, instead of being recessed from a bottom surface of the package body 12.

FIG. 7A, FIG. 7B, FIG. 7C, FIG. 7D and FIG. 7E illustrate a method of manufacturing a semiconductor device package in accordance with some embodiments of the present disclosure.

Figure 7A:
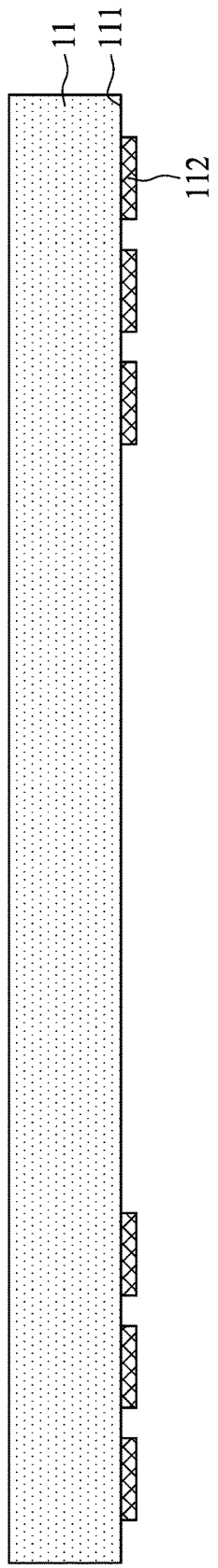
FIG. 7A, FIG. 7B, FIG. 7C, FIG. 7D and FIG. 7E illustrate a method of manufacturing a semiconductor device package in accordance with some embodiments of the present disclosure.

Referring to FIG. 7A, a substrate 11 is provided with a first surface 111 and pads 112 disposed on the first surface 111.

Figure 7B:
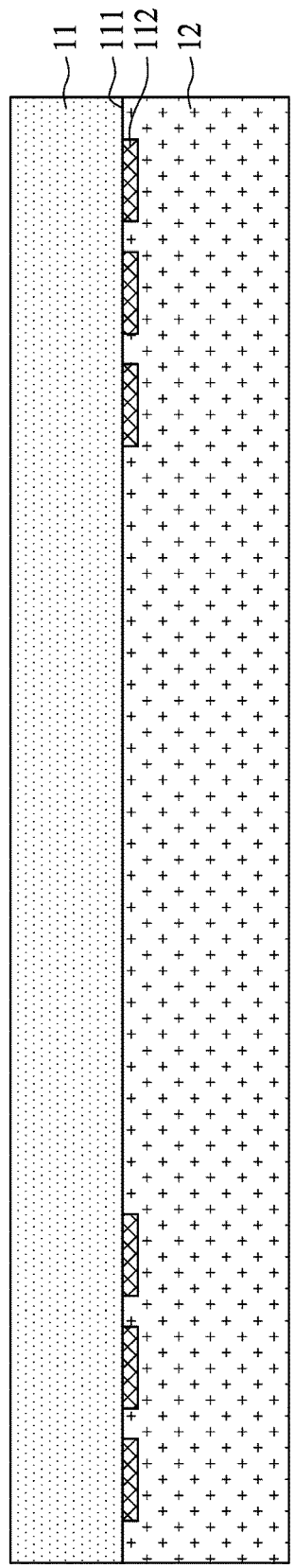

Referring to FIG. 7B, a package body 12 is provided or formed to cover the first surface 111 of the substrate 11.

Figure 7C:
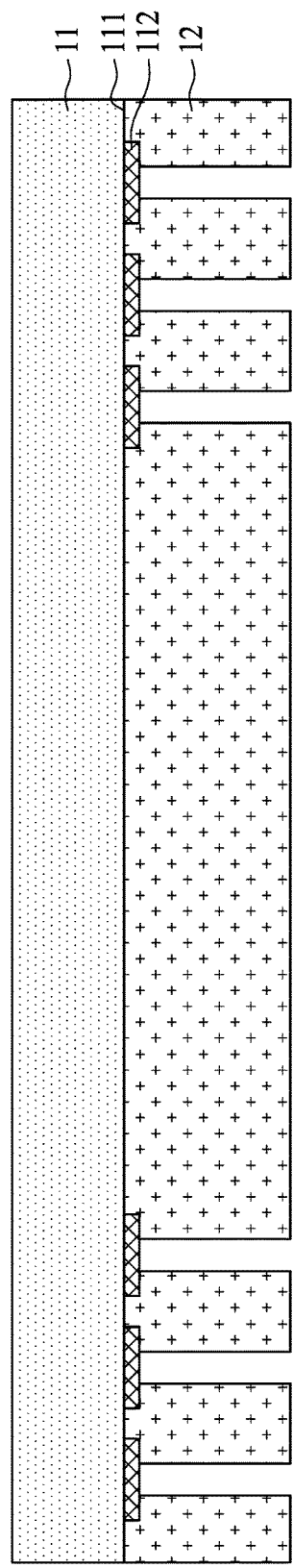

Referring to FIG. 7C, portions of the package body 12 are removed to form via holes.

Figure 7D:
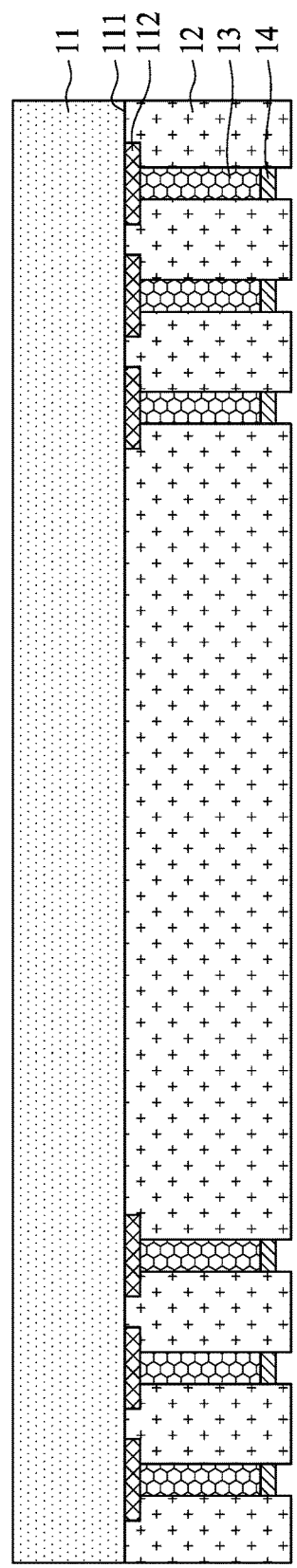

Referring to FIG. 7D, a conductive layer 13 is formed in each via hole to contact a respective pad 112 on the first surface 111 of the substrate 11. In some embodiments, the conductive layer 13 is formed with a curing operation. A first intermediate layer 14 is formed on the conductive layer 13. The method of FIG. 7A, FIG. 7B, FIG. 7C and FIG. 7D may be used to form the semiconductor device package 10 as shown in FIG. 1 by further disposing an interconnect 15 on the first intermediate layer 14. In some embodiments, the interconnect 15 is formed with a curing operation. In some embodiments, a cavity may be formed on the package body 12, wherein the cavity corresponds to and is aligned with a via.

Figure 7E:
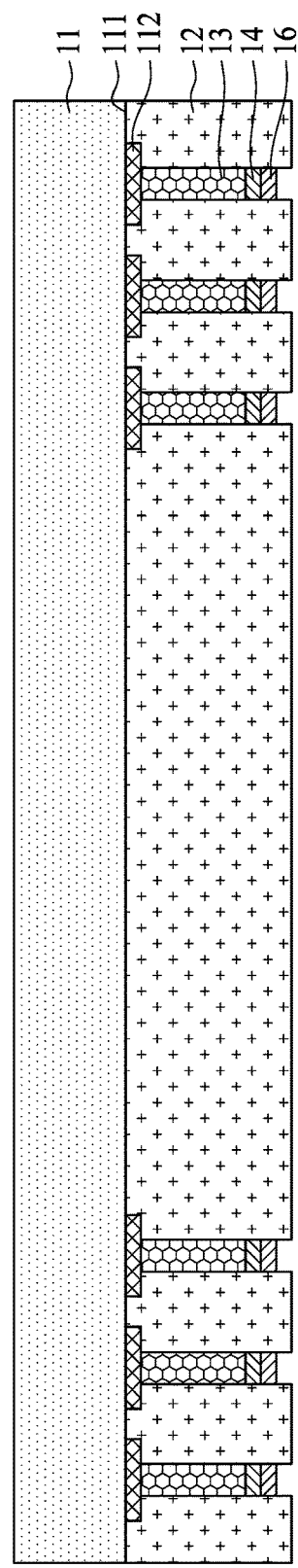

Alternatively, referring to FIG. 7E, in some embodiments, a second intermediate layer 16 is formed on the first intermediate layer 14. The method of FIG. 7A, FIG. 7B, FIG. 7C, FIG. 7D and FIG. 7E may be used to form the semiconductor device package 10 as shown in FIG. 2 by further disposing an interconnect 15 on the second intermediate layer 16.

Figure 8:
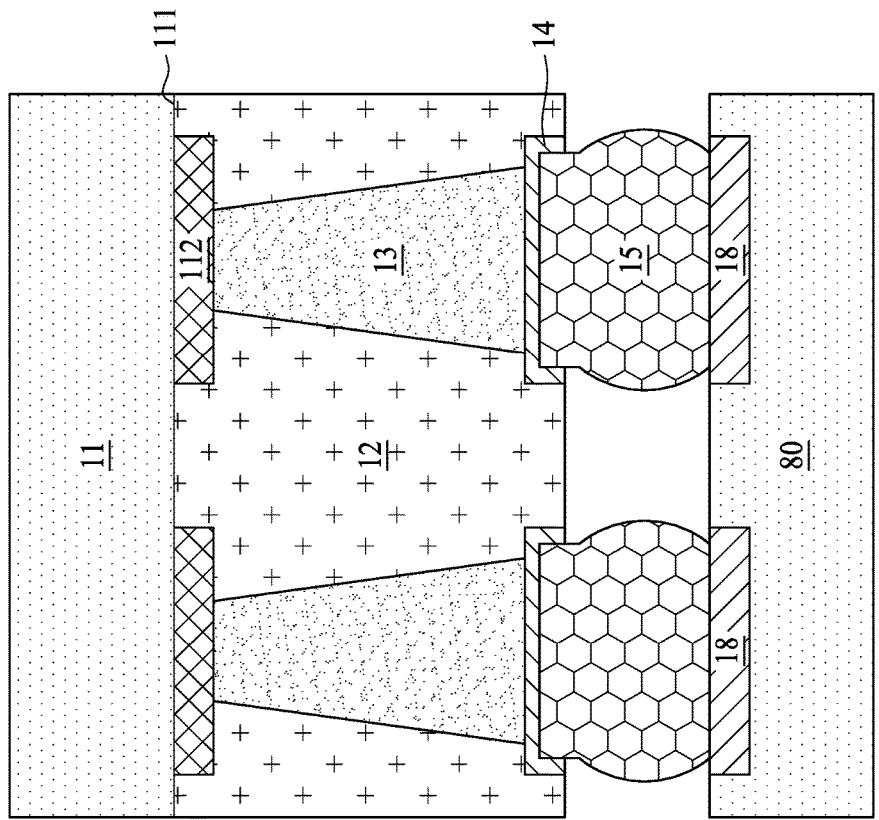
FIG. 8 illustrates a cross-sectional view of filling mold vias in accordance with some embodiments of the present disclosure.

FIG. 8 illustrates a cross-sectional view of filling mold vias in accordance with some embodiments of the present disclosure. A semiconductor device package shown in FIG. 8 is similar to the semiconductor device package 10 shown in FIG. 1, except that in FIG. 8, the package body 12 defines a cavity on a bottom surface of the package body 12, the cavity is aligned with a via, the first intermediate layer 14 is formed in the cavity and contacts the conductive layer 13, and a first junction area between the first intermediate layer 14 and the interconnect 15 is larger than a second junction area between the first intermediate layer 14 and the conductive layer 13. The interconnect 15 is used to electrically connect the pad 112 with a pad 18 on another substrate 80.

FIG. 9A, FIG. 9B, FIG. 9C, FIG. 9D, FIG. 9E, FIG. 9F and FIG. 9G illustrate cross-sectional views of via holes or filling mold vias in accordance with some embodiments of the present disclosure. The via holes shown in FIG. 9A, FIG. 9B, FIG. 9C, FIG. 9D, FIG. 9E, FIG. 9F and FIG. 9G may be formed by, for example, laser drilling.

Figure 9A:
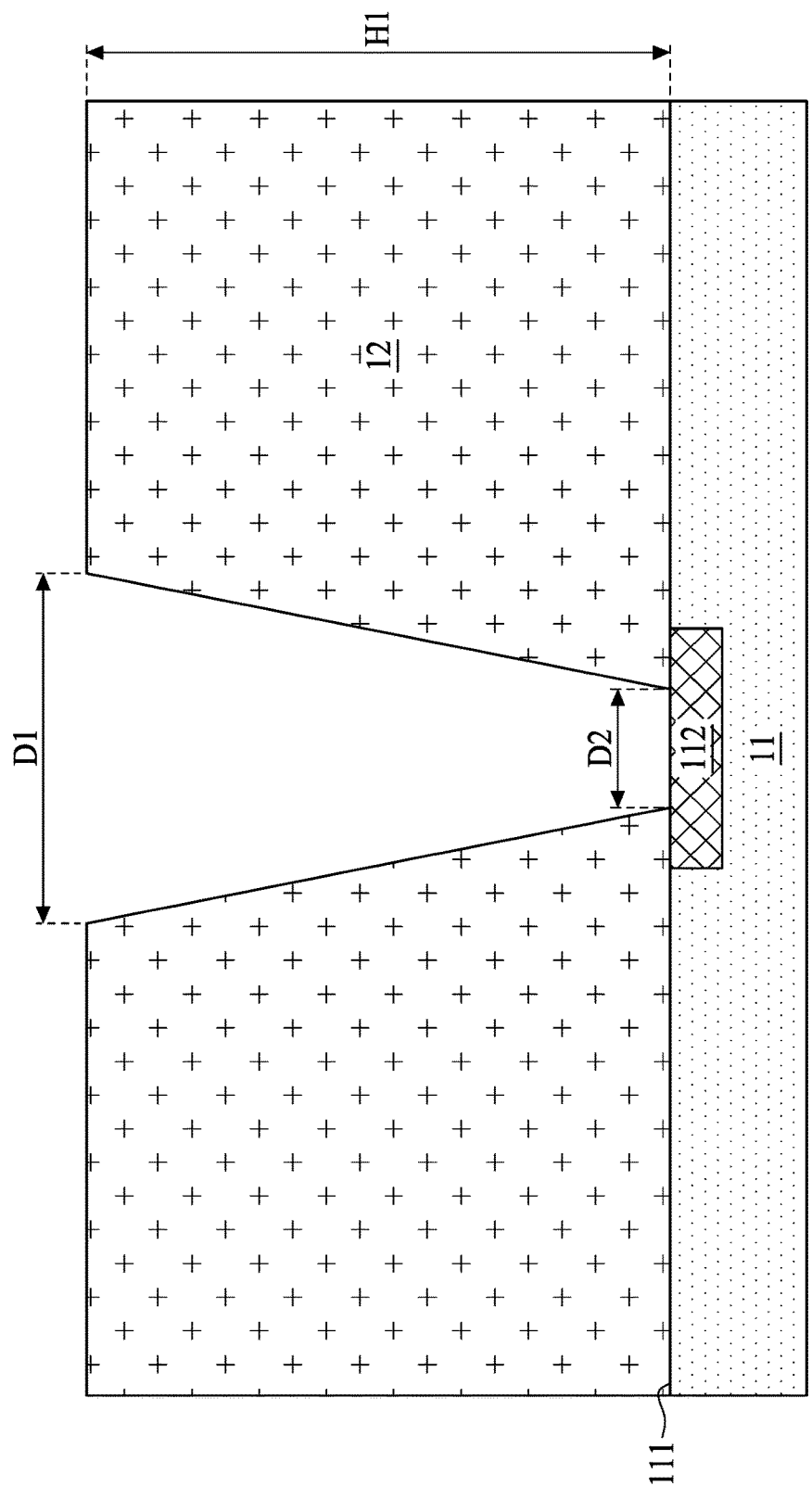

Referring to FIG. 9A, in some embodiments, the via hole of a filling mold via is tapered from a surface of the package body 12 (that is opposite to the junction between the first surface 111 of the substrate 11 and the package body 12) toward the first surface 111 of the substrate 11. Therefore, a diameter or width D1 of the via hole at the surface of the package body 12 is larger than a diameter or width D2 of the via hole at the first surface 111 of the substrate 11. In some embodiments, when the thickness H1 of the package body 12 is about 200 µm to about 1400 µm, the diameter D1 of the via hole is about 200 µm to about 500 µm and the diameter D2 of the via hole is about 200 µm to about 500 µm.

Figure 9B:
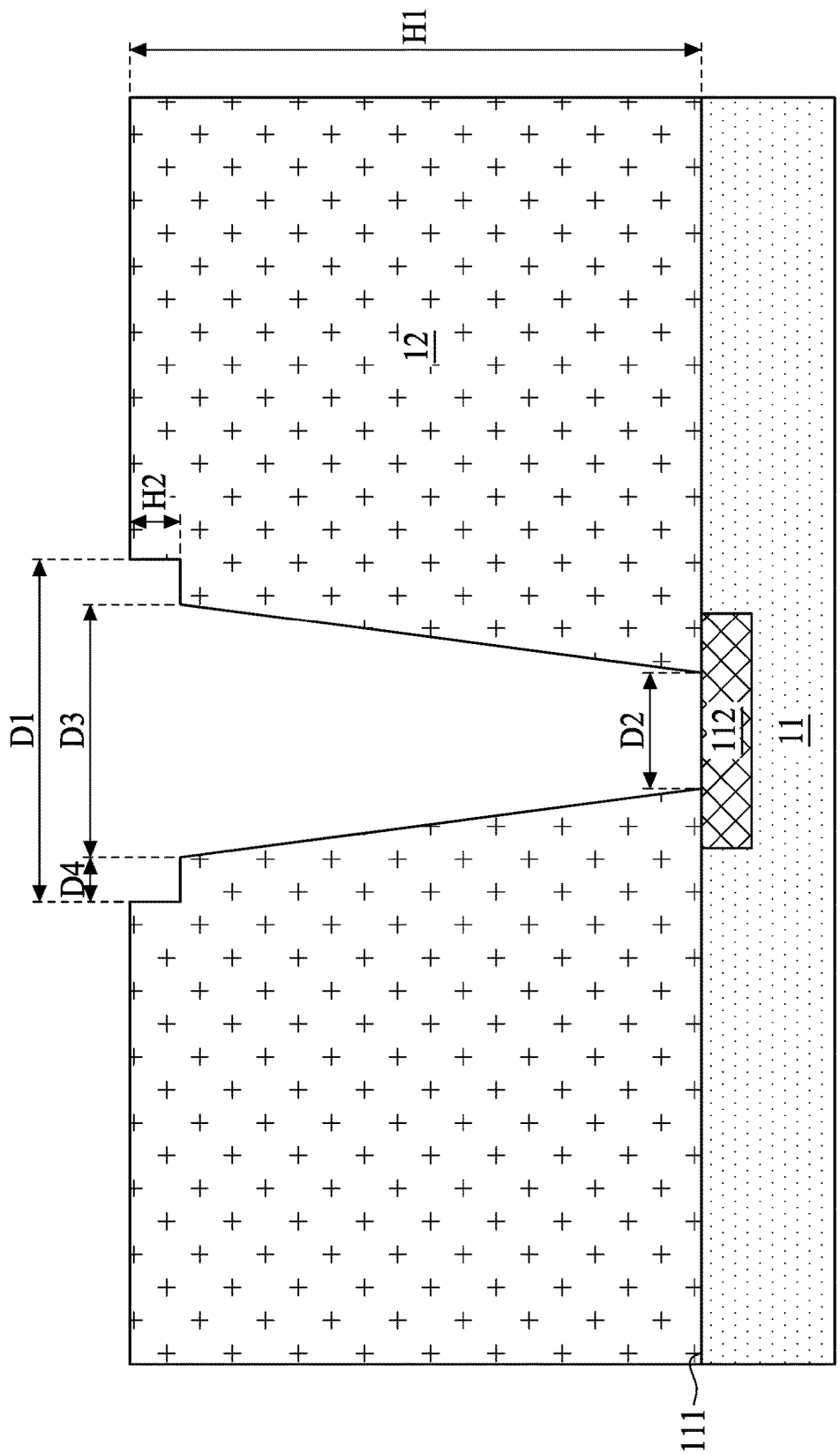

Referring to FIG. 9B, the via hole shown in FIG. 9B is similar in certain respects to the via hole shown in FIG. 9A, except that in FIG. 9B, the via hole further comprises a T-shape cavity near the surface of the package body 12 that is opposite to the junction between the first surface 111 of the substrate 11 and the package body 12. The package body 12 defines a step on the top of the via hole with a thickness H2. A diameter D1 of the via hole at the top of the step is larger than a diameter D3 at the bottom of the step, wherein D1=D3+2×D4. In some embodiments, when the thickness H1 of the package body is about 200 µm to about 1400 µm, the thickness H2 of the step is about 50 µm to about 100 µm, the diameter D1 of the via hole is about 200 µm to about 500 µm, the diameter D2 of the via hole is about 200 µm to about 500 µm and the diameter D3 of the via hole is about 100 µm to about 180 µm. The difference D4 between D1 and D3 is about 10 µm to about 50 µm.

Figure 9C:
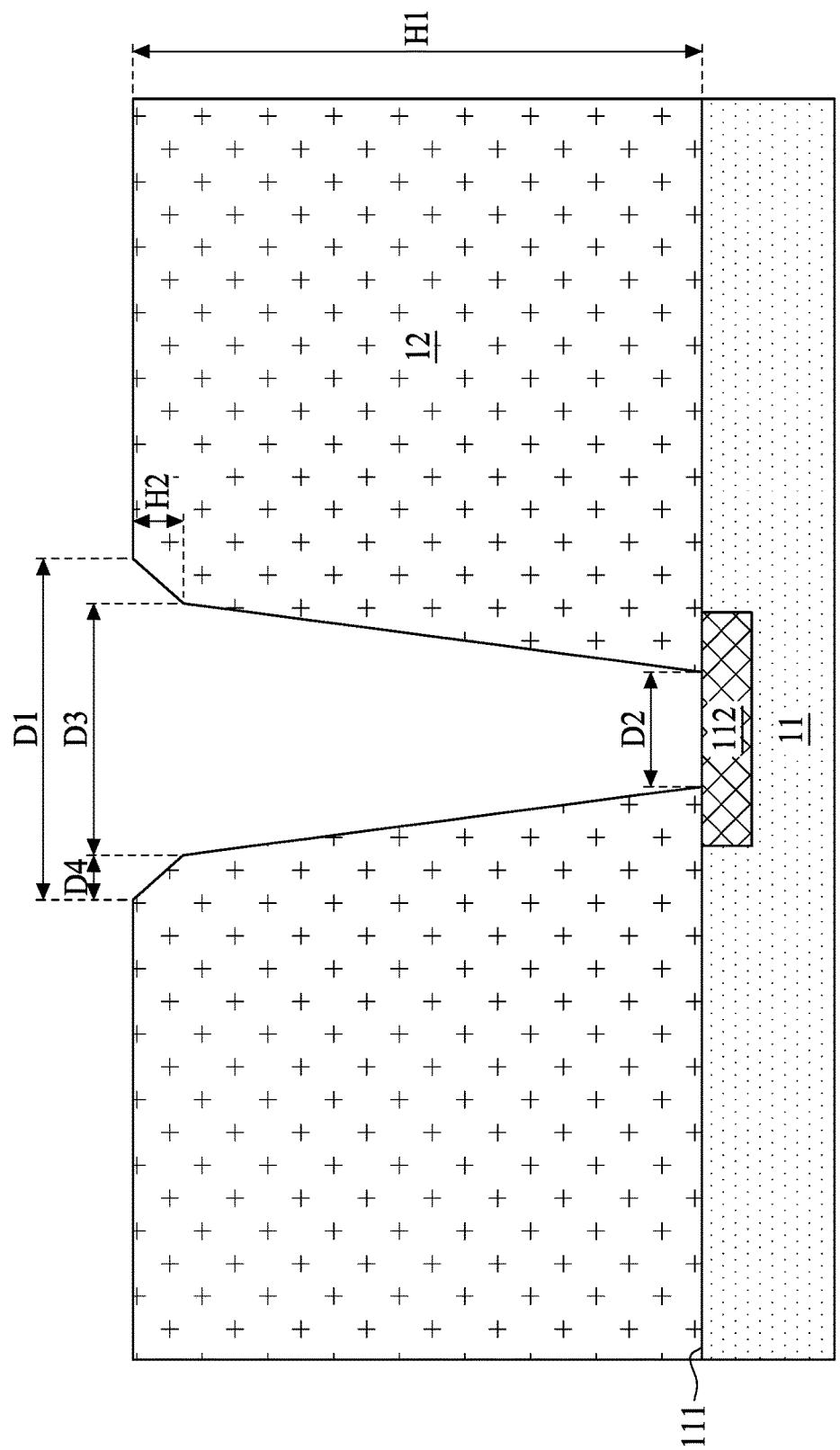

Referring to FIG. 9C, the via hole shown in FIG. 9C is similar in certain respects to the via hole shown in FIG. 9A, except that in FIG. 9C, the via hole further comprises a tapered cavity with a gradient at a portion near the surface of the package body 12 that is opposite to the junction between the first surface 111 of the substrate 11 and the package body 12. The gradient is different from a gradient in another portion of the via hole. The portion of the via hole has a thickness H2. A diameter D1 of the via hole at the top of the gradient is larger than a diameter D3 at the bottom of the gradient. In some embodiments, when the thickness H1 of the package body is about 200 µm to about 1400 µm, the diameter D1 of the via hole is about 200 µm to about 500 µm, the diameter D2 of the via hole is about 200 µm to about 500 µm, the diameter D3 of the via hole is about 100 µm to about 180 µm and the thickness H2 of the portion is about 50 µm to about 100 µm. The difference D4 between D1 and D3 is about 10 µm to about 50 µm.

Figure 9D:
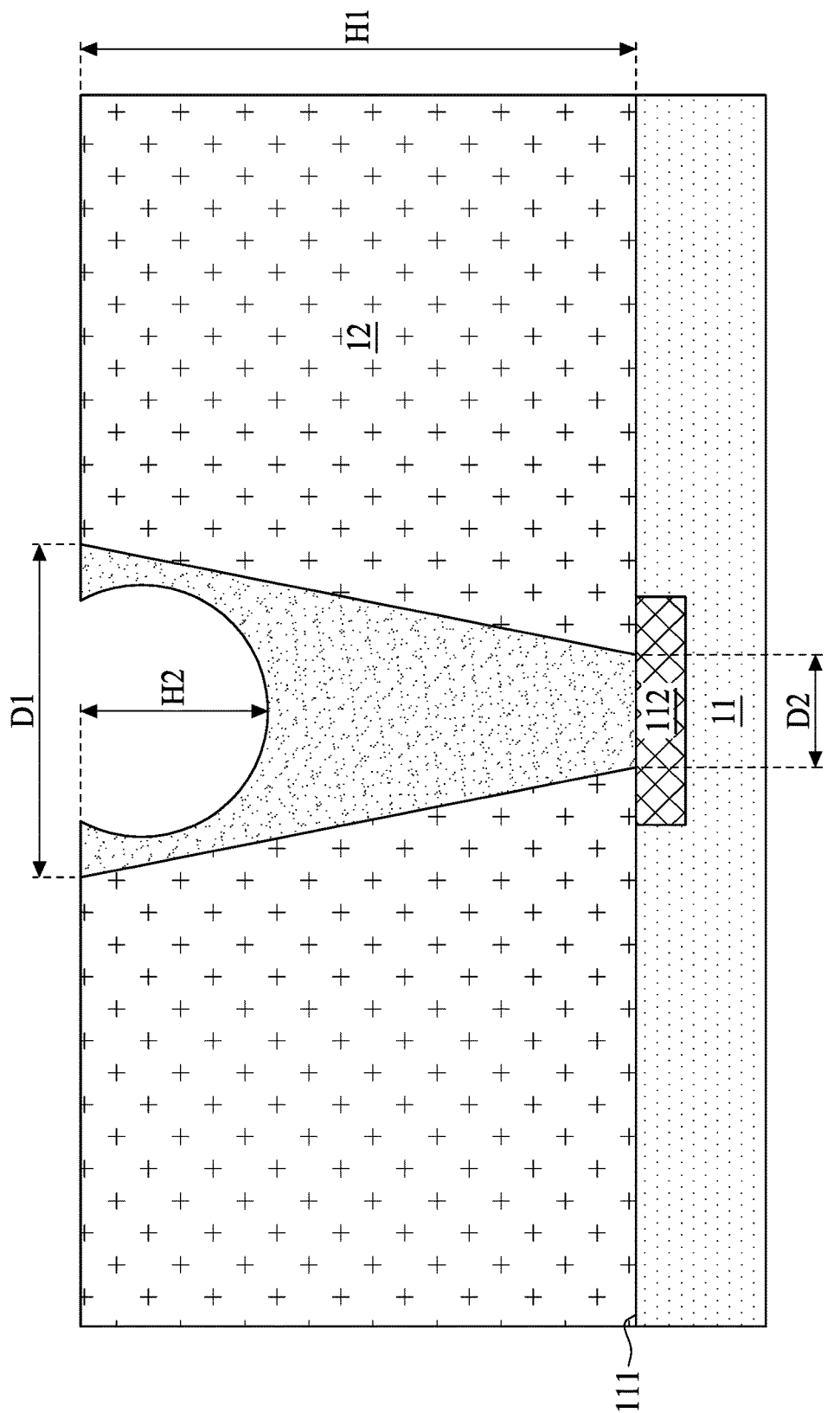

Referring to FIG. 9D, the via hole shown in FIG. 9D is similar in certain respects to the via hole shown in FIG. 9A, except that in FIG. 9D, a conductive layer filled into the via hole defines a cavity with a height of H2 in the via. In some embodiments, when the thickness H1 of the package body 12 is about 200 µm to about 1400 µm, the diameter D1 of the via hole is about 200 µm to about 500 µm, the diameter D2 of the via hole is about 200 µm to about 500 µm and the height H2 of the cavity is about 50 µm to about 100 µm.

Figure 9E:
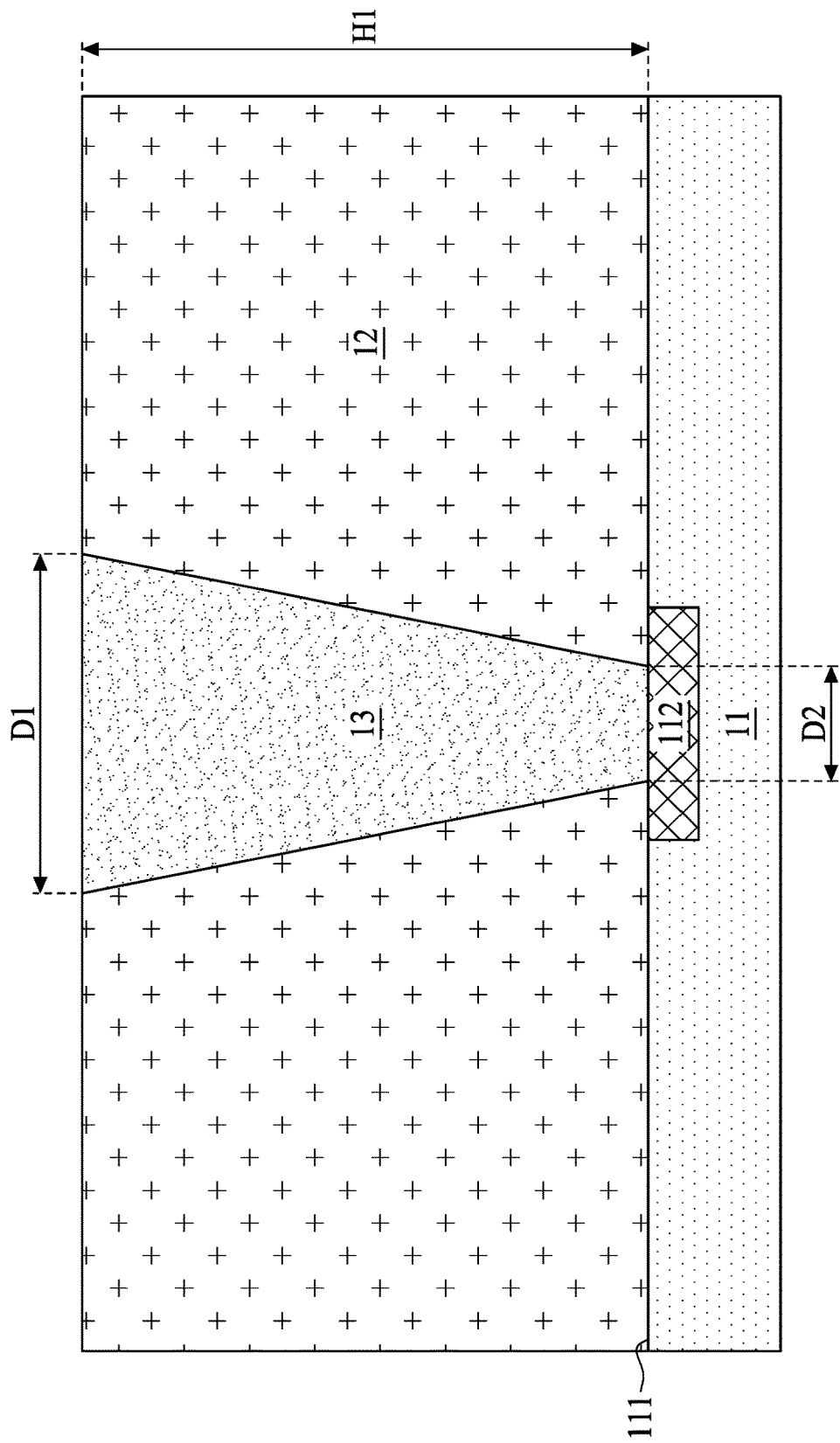

Referring to FIG. 9E, the via hole shown in FIG. 9E is similar in certain respects to the via hole shown in FIG. 9A, except that in FIG. 9E, a conductive layer 13 filled into the via hole has a substantially flat top. In some embodiments, when the thickness H1 of the package body 12 is about 200 µm to about 1400 µm, the diameter D1 of the via hole is about 200 µm to about 500 µm and the diameter D2 of the via hole is about 200 µm to about 500 µm.

Referring to FIG. 9F, the via hole shown in FIG. 9F is similar in certain respects to the via hole shown in FIG. 9A, except that in FIG. 9F, the conductive layer 13 filled into the via hole protrudes from the top of the via hole with a height H2. In some embodiments, when the thickness H1 of the package body is about 200 µm to about 1400 µm, the diameter D1 of the via hole is about 200 µm to about 500 µm, the diameter D2 of the via hole is about 200 µm to about 500 µm and the height H2 of the protruding portion is about 0 µm to about 150 µm.

Figure 9G:
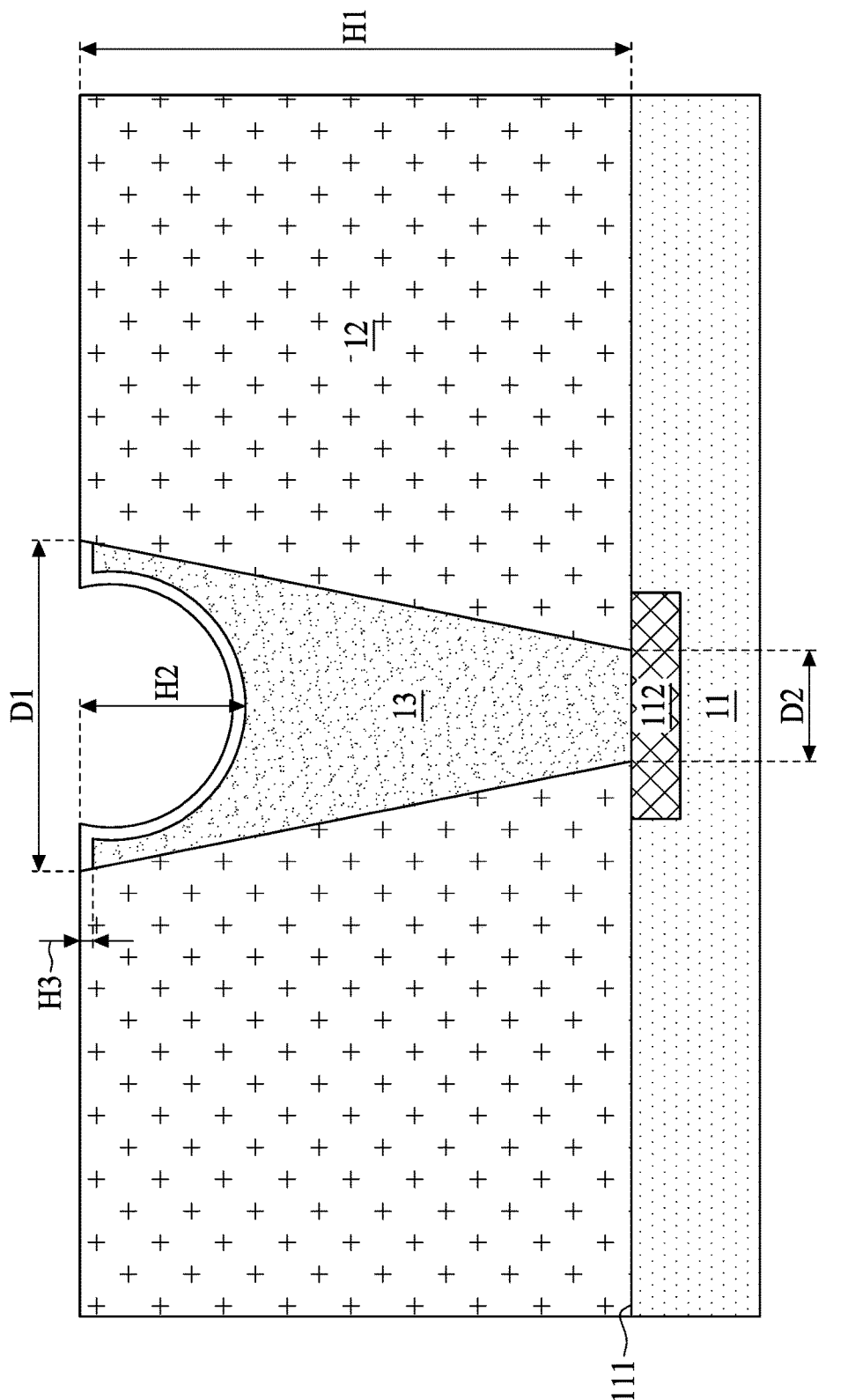

Referring to FIG. 9G, the via hole shown in FIG. 9G is similar in certain respects to the via hole shown in FIG. 9D, except that in FIG. 9G, a first intermediate layer with a thickness H3 is formed in the cavity and contacts the conductive layer 13. In some embodiments, when the thickness H1 of the package body is about 200 µm to about 1400 µm, the diameter D1 of the via hole is about 200 µm to about 500 µm, the diameter D2 of the via hole is about 200 µm to about 500 µm, the height H2 of the cavity is about 50 µm to about 150 µm and the thickness H3 of the first intermediate layer is about 1 µm to about 10 µm.

FIG. 10A, FIG. 10B, FIG. 10C, FIG. 10D, FIG. 10E, FIG. 10F, FIG. 10G, FIG. 10H, FIG. 10I and FIG. 10J illustrate a method of manufacturing a semiconductor device package in accordance with some embodiments of the present disclosure.

Figure 10A:
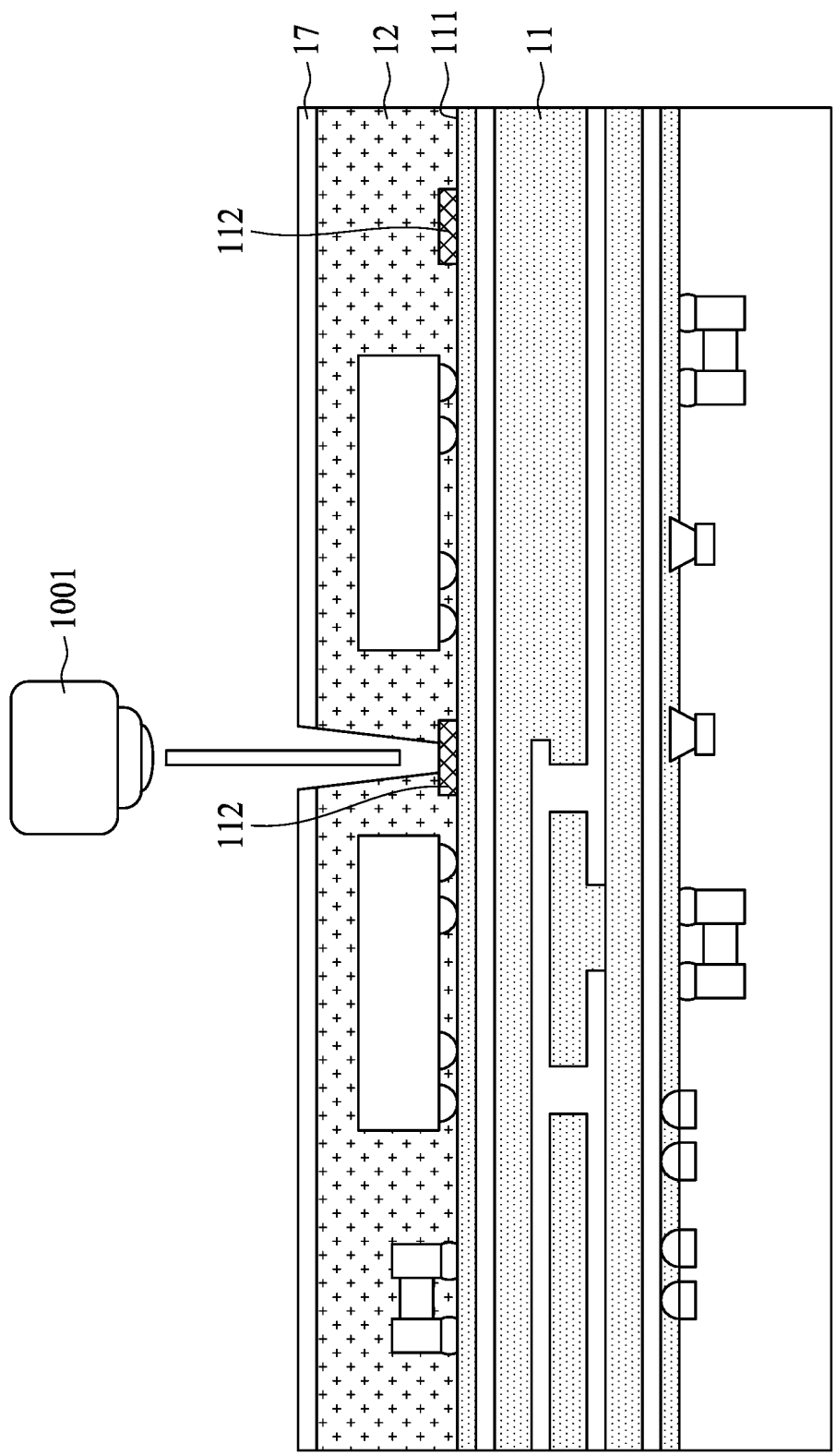
FIG. 10A, FIG. 10B, FIG. 10C, FIG. 10D, FIG. 10E, FIG. 10F, FIG. 10G, FIG. 10H, FIG. 10I and FIG. 10J illustrate a method of manufacturing a semiconductor device package in accordance with some embodiments of the present disclosure.

Referring to FIG. 10A, a semiconductor device package includes a substrate 11, a package body 12, a plurality of electrical components (e.g., semiconductor device, resistor, capacitor, and so forth) on both sides of the substrate 11. The substrate 11 has a first surface 111 and pads 112 on the first surface 111. The package body 12 covers at least a portion of the first surface 111 of the substrate 11 and encapsulates at least some of the electrical components. Portions of the package body 12 are removed by cutting, laser drilling, etching or other removal process to form via holes. As shown in FIG. 10A, a laser drilling device 1001 is used to remove a portion of the package body 12. A tape 17 is on a surface of the package body 12 that is opposite to the junction between the first surface 111 of the substrate 11 and the package body 12. The pads 112 are exposed by the via holes.

Figure 10B:
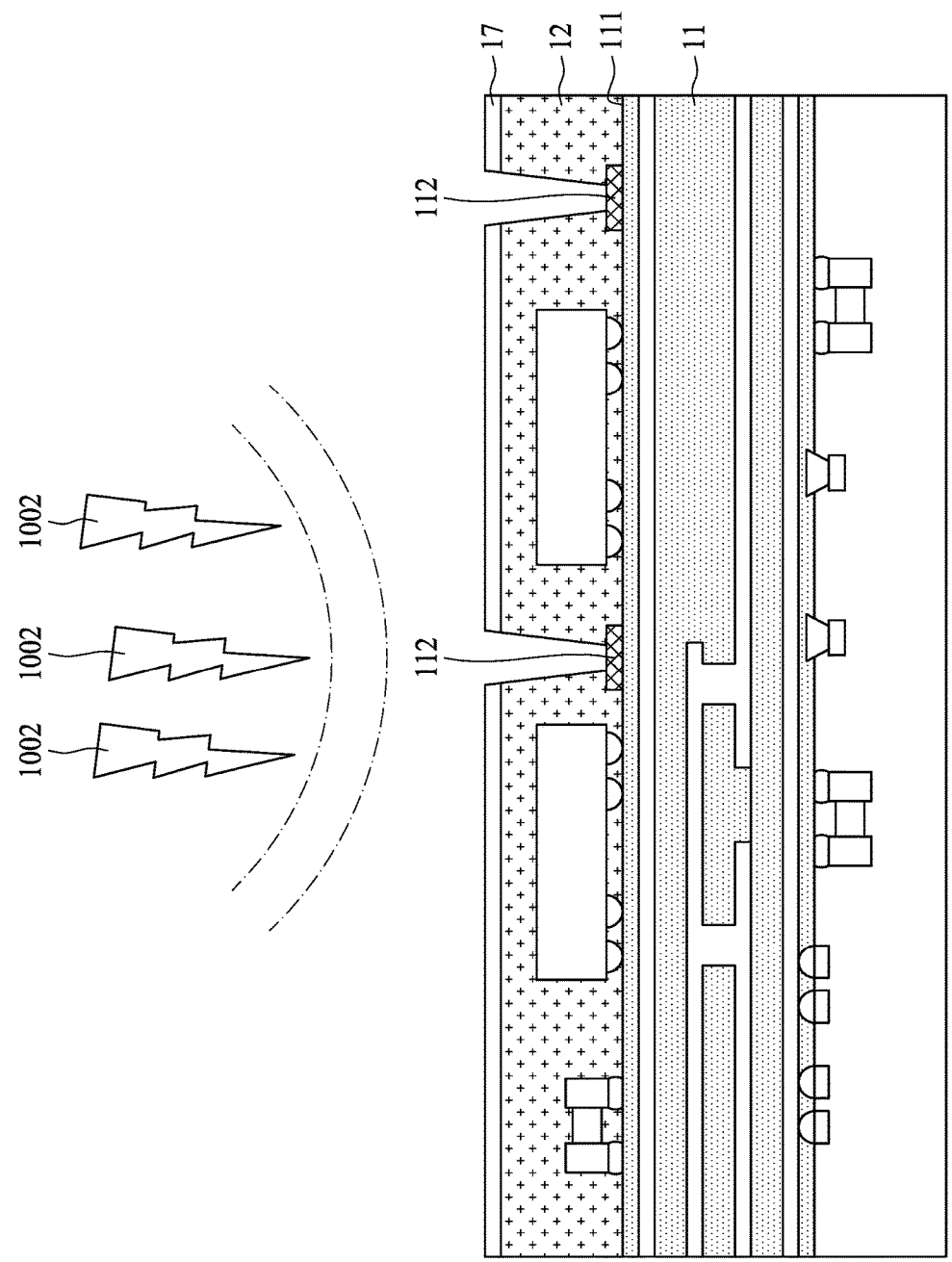

Referring to FIG. 10B, after the via holes are formed, plasma 1002 is used to clean the via holes.

Figure 10C:
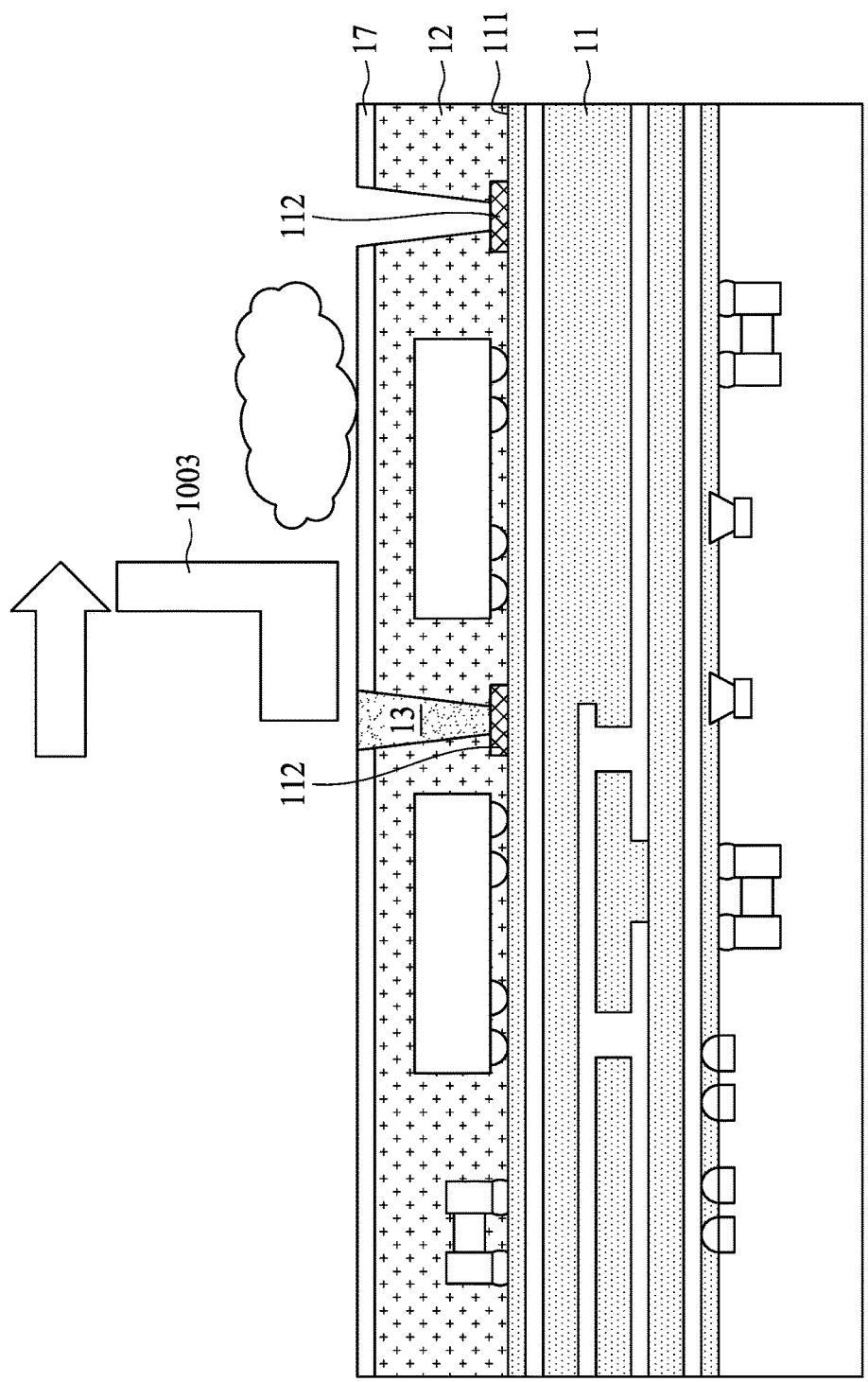

Referring to FIG. 10C, solder paste is printed into the via holes and on the tape 17. A scraping tool 1003 is used to remove the solder paste on the tape 17 and leave the solder paste in the via holes.

Figure 10D:
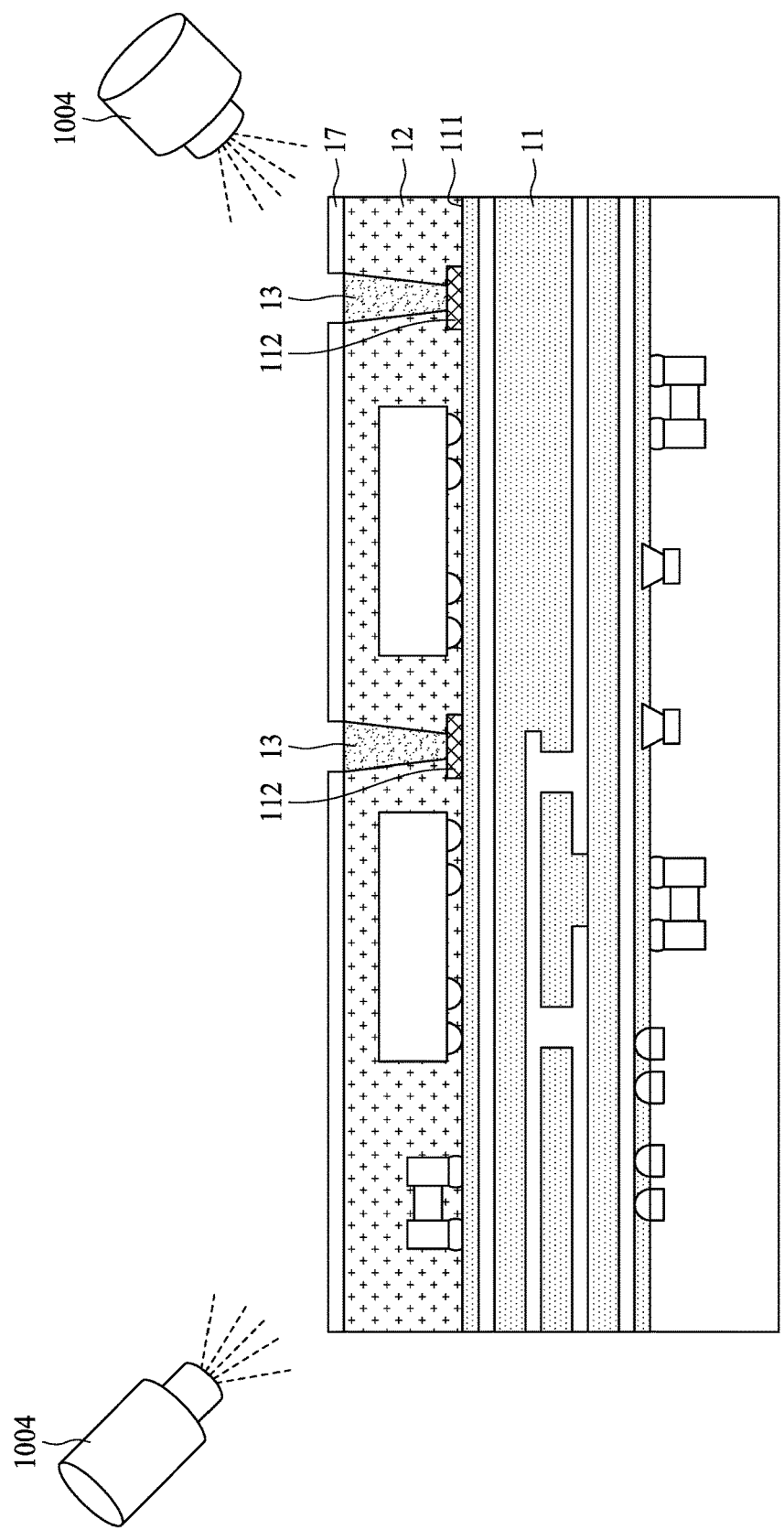

Referring to FIG. 10D, a curing operation is provided to cure the solder paste to form a conductive layer 13 in each via hole. In some embodiments, the solder paste can be cured by irradiating the solder paste with ultraviolet (UV) light from UV lamps 1004.

Figure 10E:
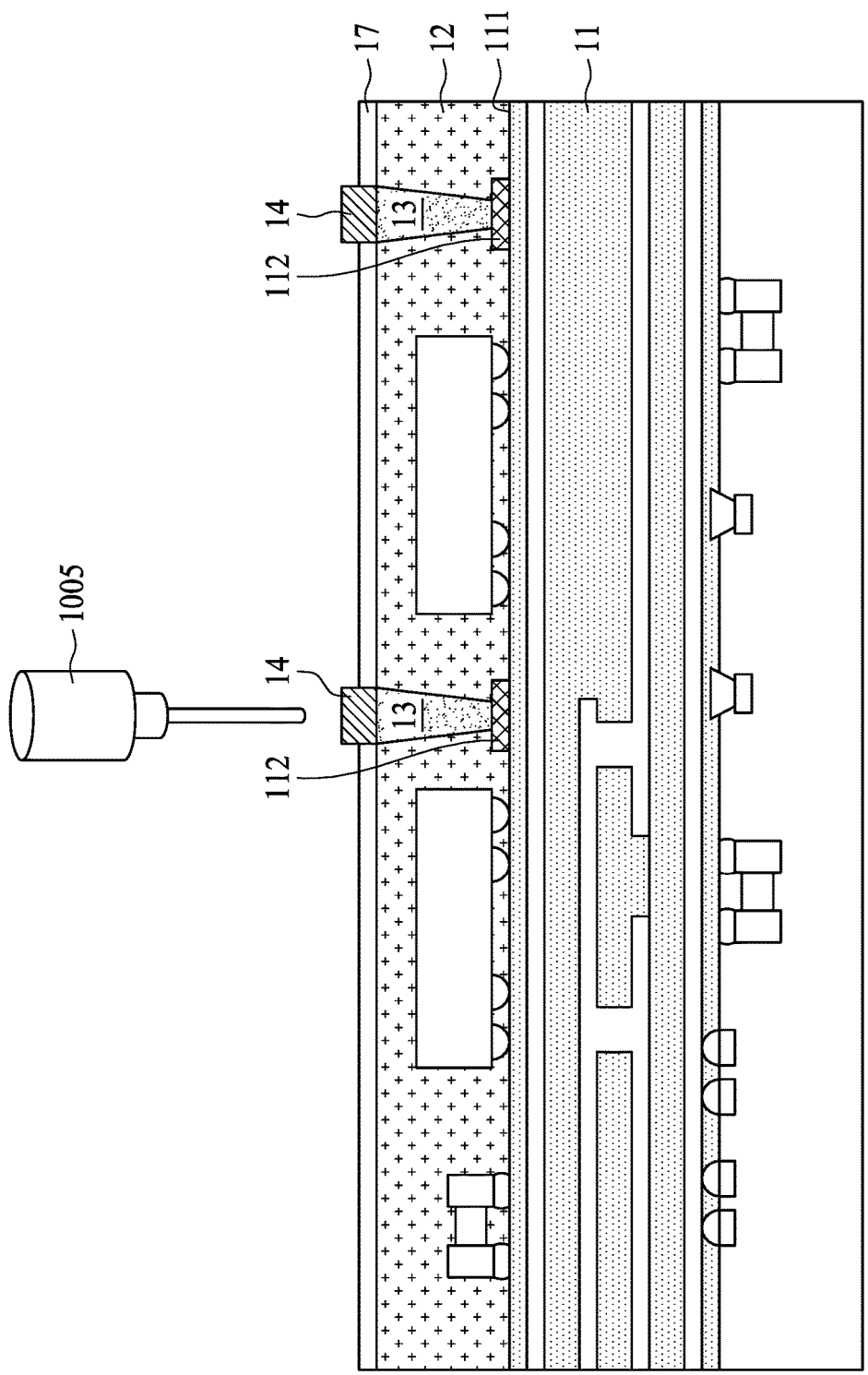

Referring to FIG. 10E, a first intermediate layer 14 can be formed by filling a silver-containing adhesive on the conductive layer 13 with a filling tool 1005.

Figure 10F:
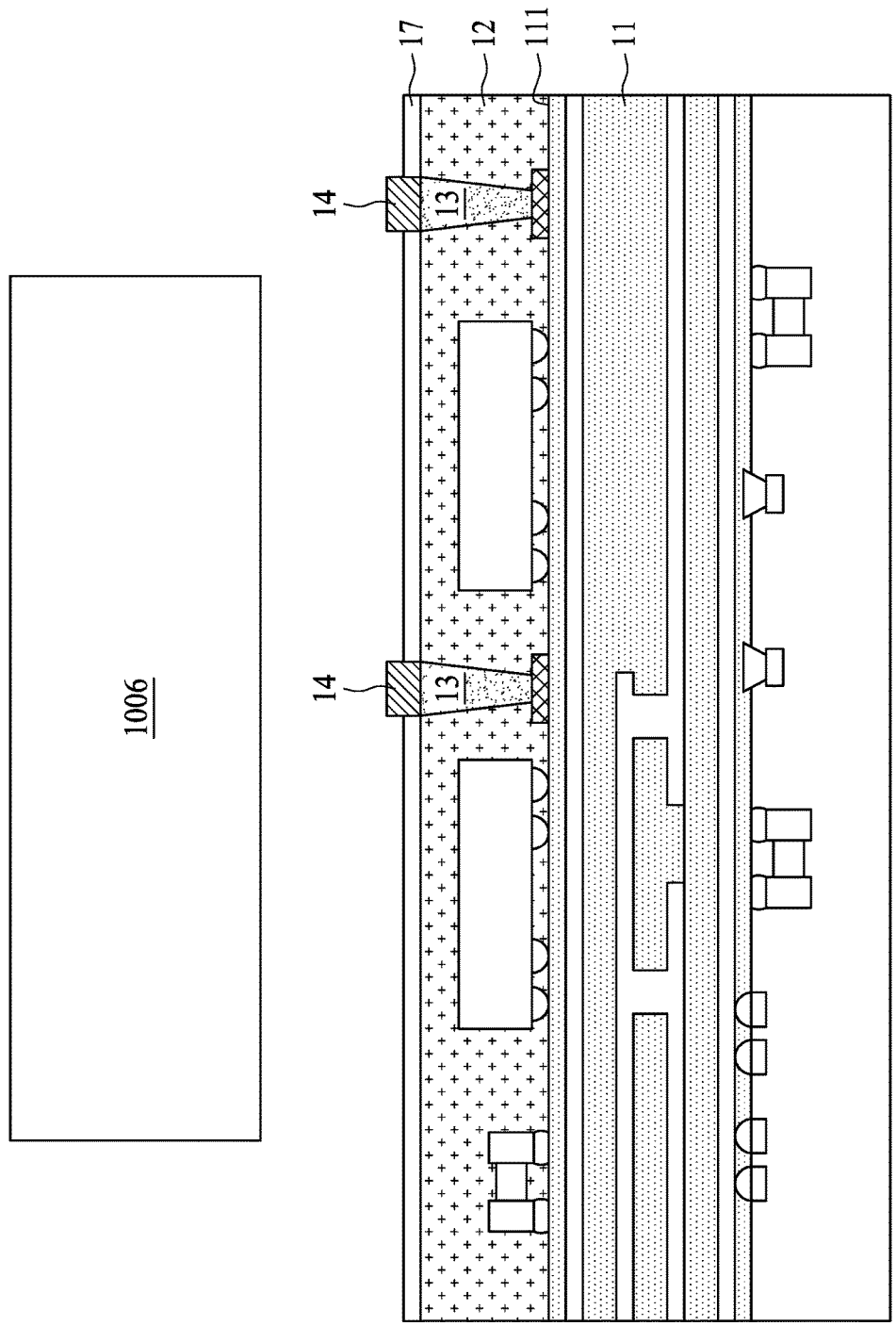

Referring to FIG. 10F, the first intermediate layer 14 can also be formed by sputtering a conductive material onto the conductive layer 13 with a sputtering tool 1006.

Figure 10G:
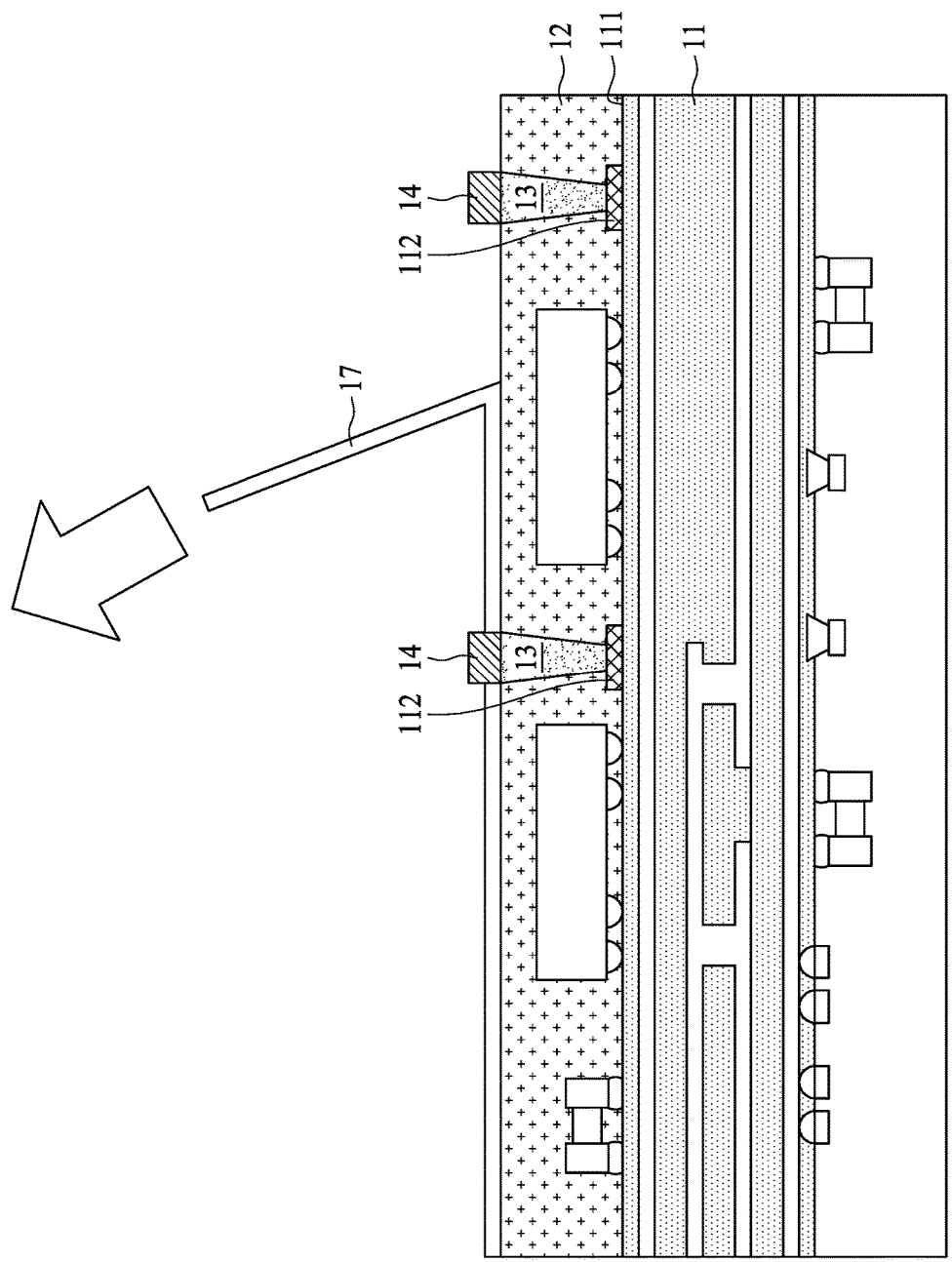

Referring to FIG. 10G, the tape 17 is removed to expose the surface of the package body 12.

Figure 10H:
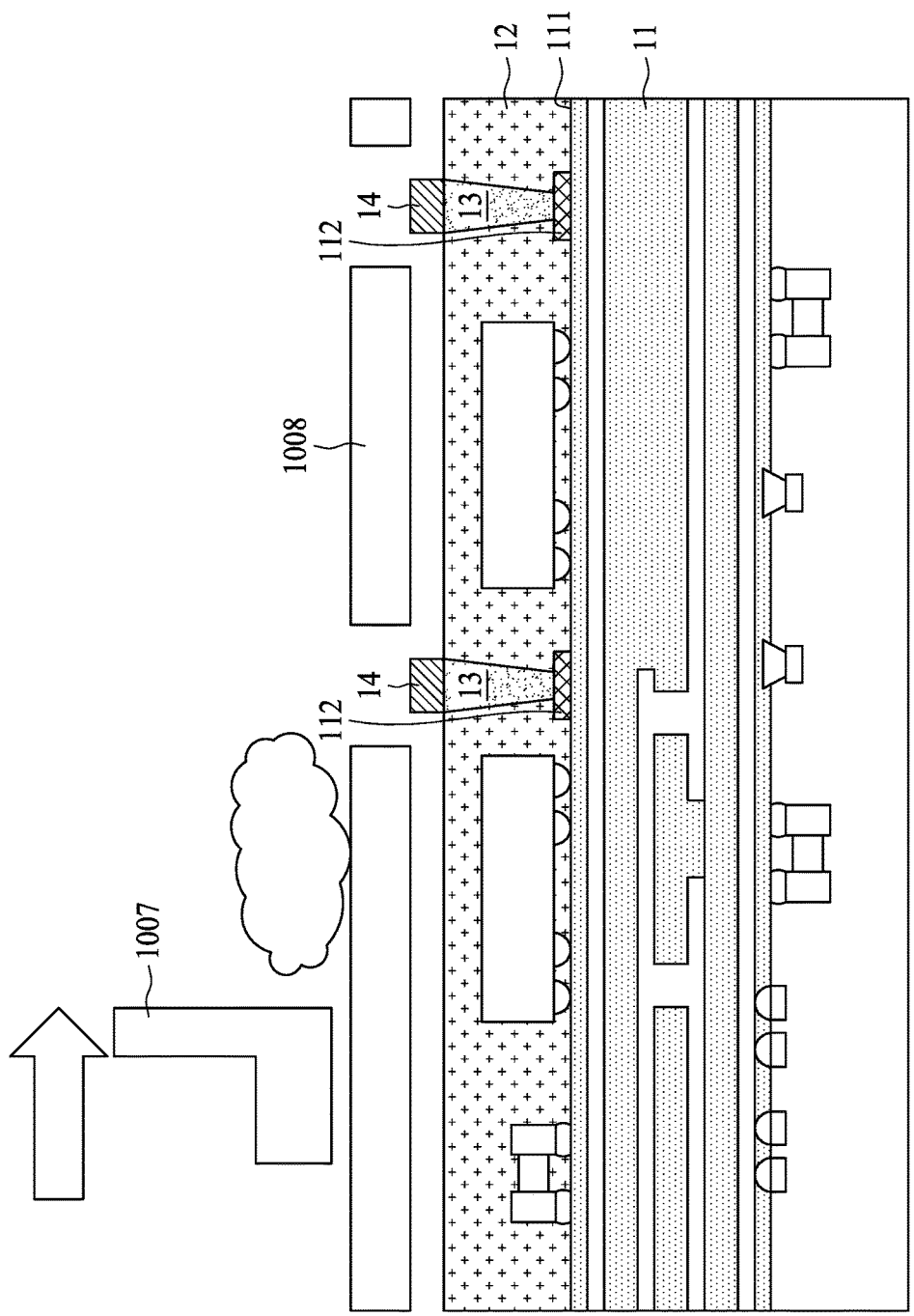

Referring to FIG. 10H, a mask 1008 can be used to selectively expose a space near the first intermediate layer 14. Solder paste can be printed into the space and onto the mask 1008. A scraping tool 1007 is used to remove the solder paste on the mask 1008 and leave the solder paste in the space to form the interconnects 15 shown in FIG. 10J. A semiconductor device package as shown in FIG. 10J may thus be formed.

Figure 10I:
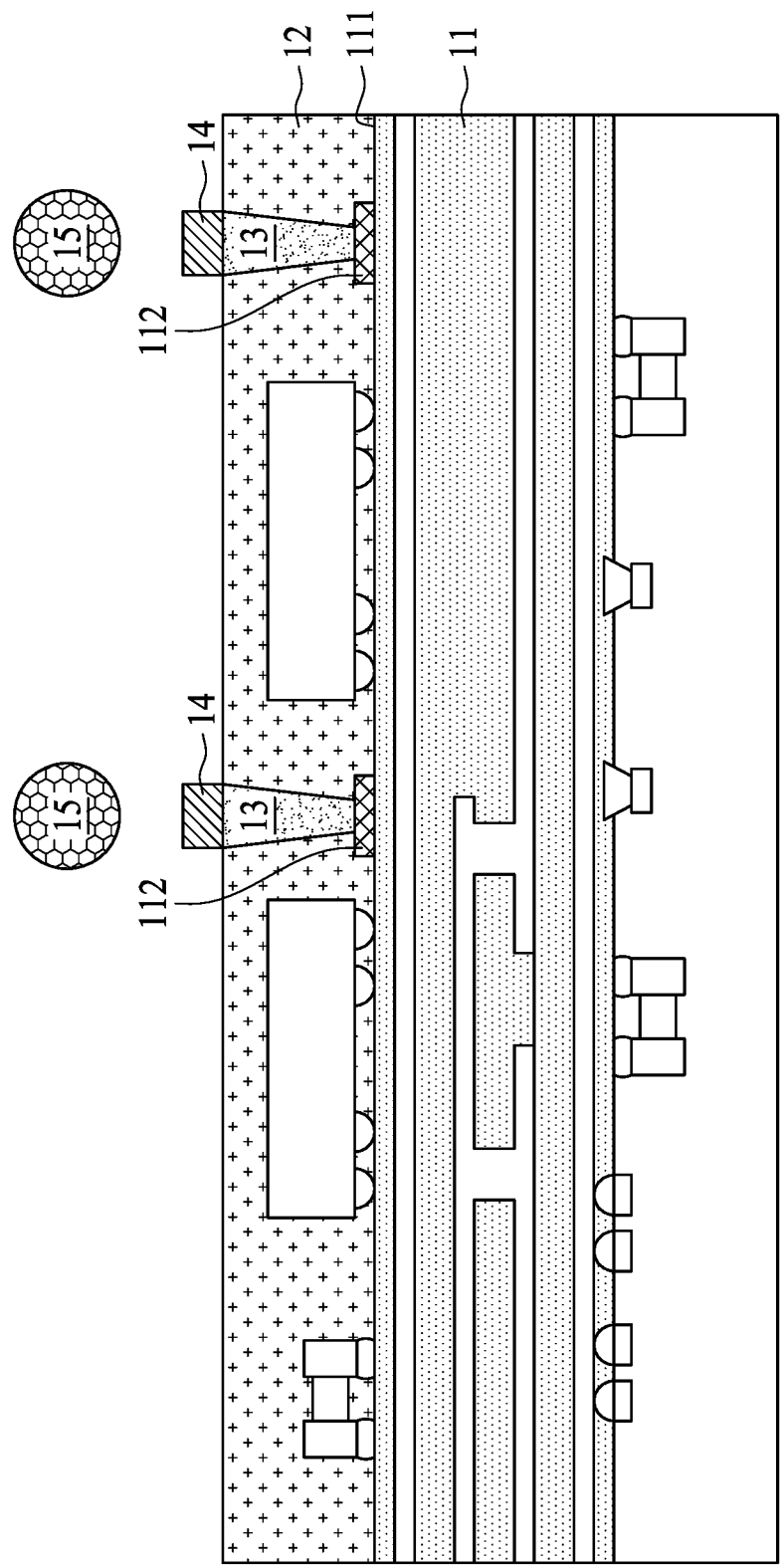
Figure 10J:
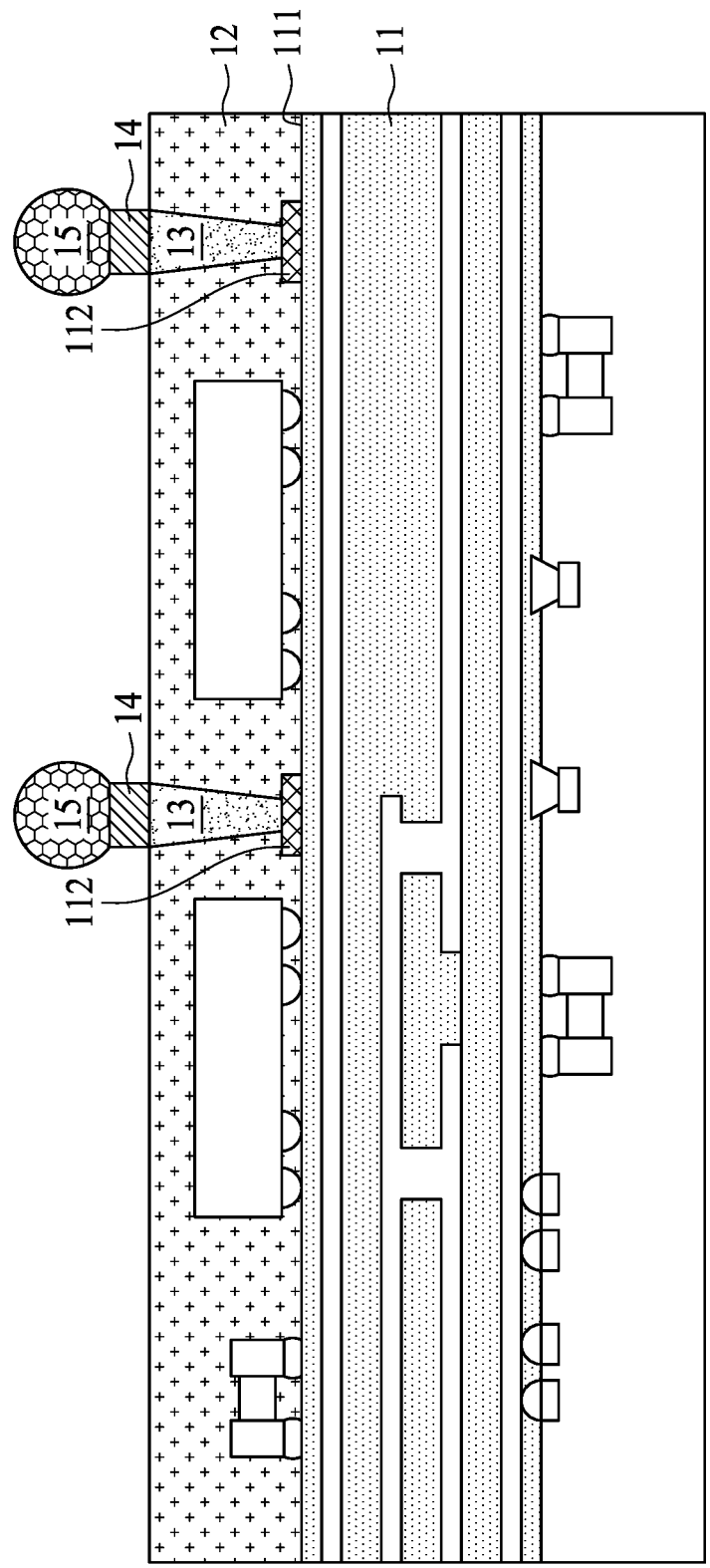

Alternatively, referring to FIG. 10I, the interconnects 15 can be connected to the first intermediate layer 14 by directly mounting solder balls on to the first intermediate layer 14. The semiconductor device package as shown in FIG. 10J may thus be formed.

FIG. 11A, FIG. 11B, FIG. 11C, FIG. 11D, FIG. 11E, FIG. 11F, FIG. 11G, FIG. 11H, FIG. 11I, FIG. 11J and FIG. 11K illustrate a method of manufacturing a double side molding package structure in accordance with some embodiments of the present disclosure.

Figure 11A:
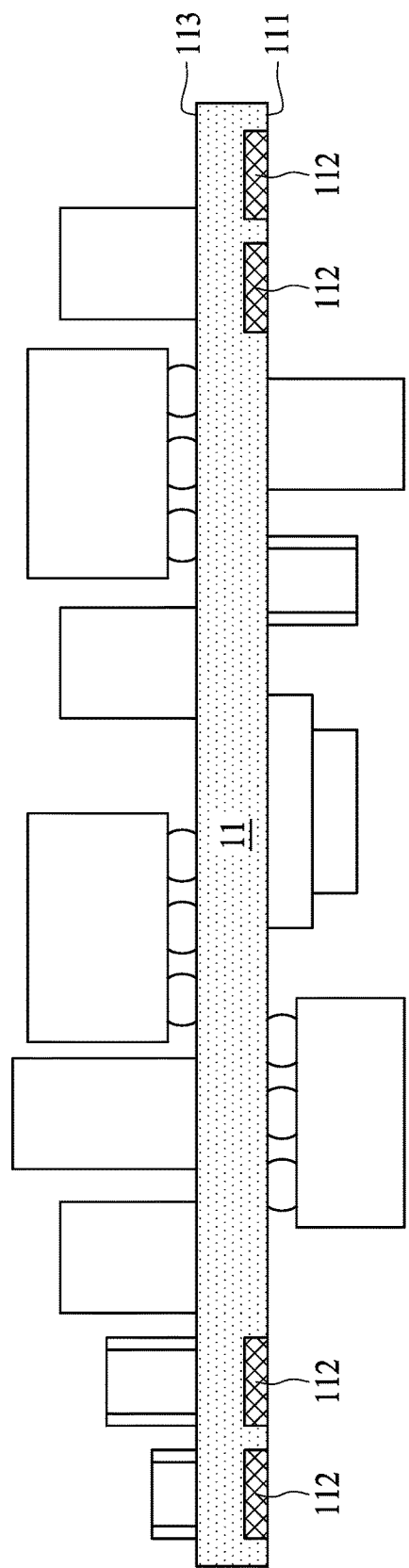
FIG. 11A, FIG. 11B, FIG. 11C, FIG. 11D, FIG. 11E, FIG. 11F, FIG. 11G, FIG. 11H, FIG. 11I, FIG. 11J, and FIG. 11K illustrate a method of manufacturing a double side molding package structure in accordance with some embodiments of the present disclosure.

Referring to FIG. 11A, a semiconductor device package includes a substrate 11 and a plurality of electrical components (e.g., semiconductor device, resistor, capacitor, and so forth) on both sides of the substrate 11. The substrate 11 has a first surface 111, a second surface 113 opposite to the first surface 111 and pads 112 on the first surface 111.

Figure 11B:
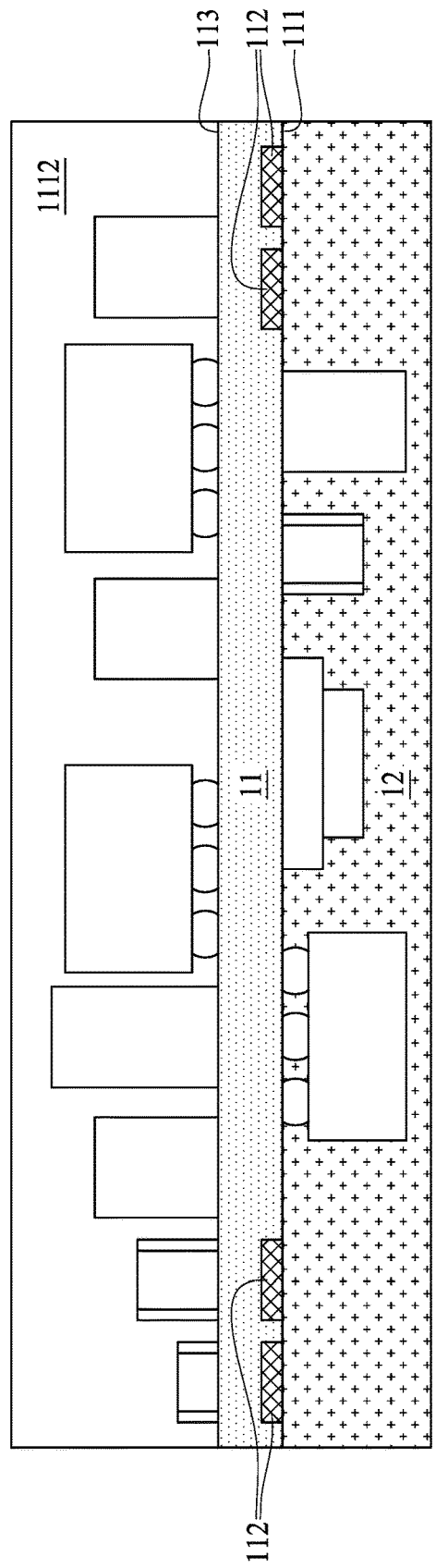

Referring to FIG. 11B, a package body 12 is formed to cover the first surface 111 of the substrate 11 and encapsulates at least some of the electrical components. A package body 1112 is formed to cover the second surface 113 of the substrate 11 and encapsulates remaining ones of the electrical components.

Figure 11C:
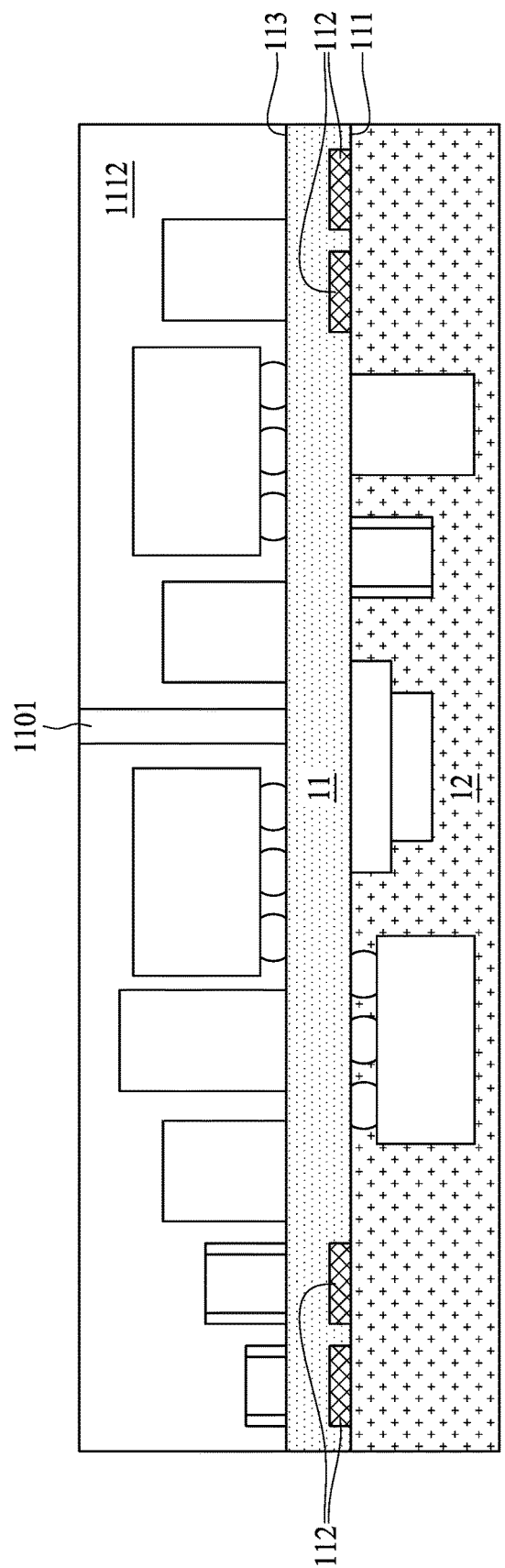

Referring to FIG. 11C, a portion of the package body 1112 is removed by cutting, laser drilling, etching or other removal process to form a trench 1101.

Figure 11D:
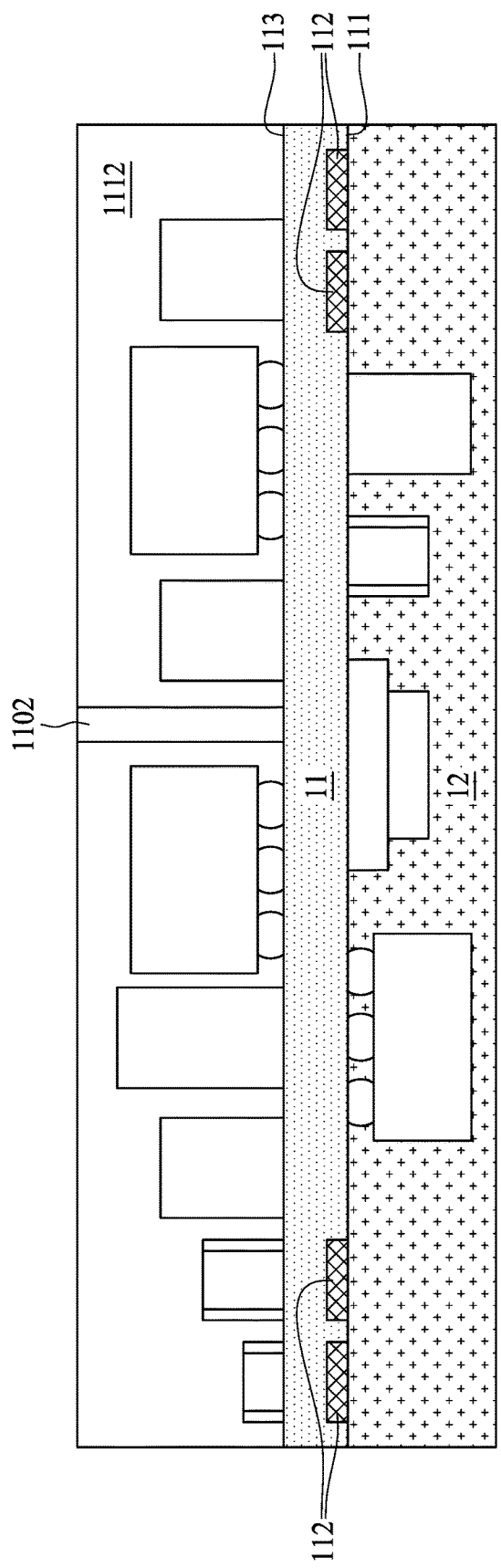

Referring to FIG. 11D, a conductive material is filled into the trench 1101 of FIG. 11C to form a compartment shield 1102.

Figure 11E:
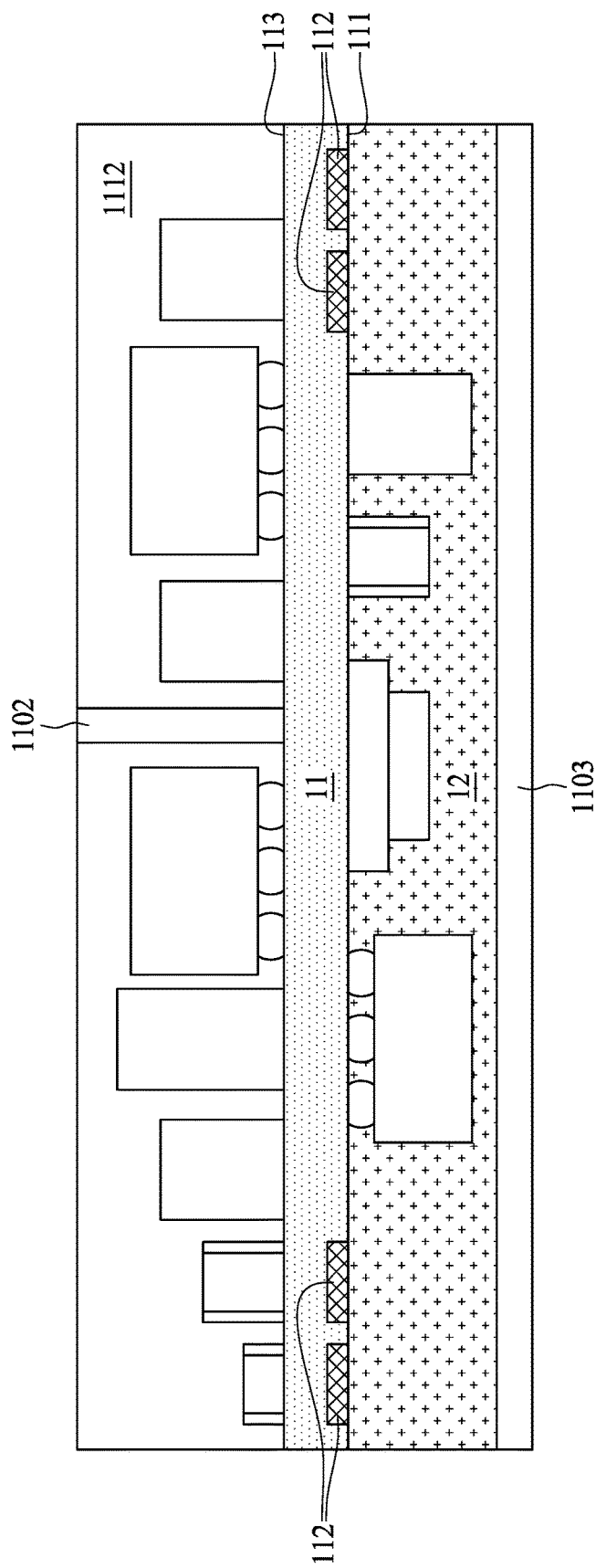

Referring to FIG. 11E, a mask layer 1103 is formed to cover a surface of the package body 12.

Figure 11F:
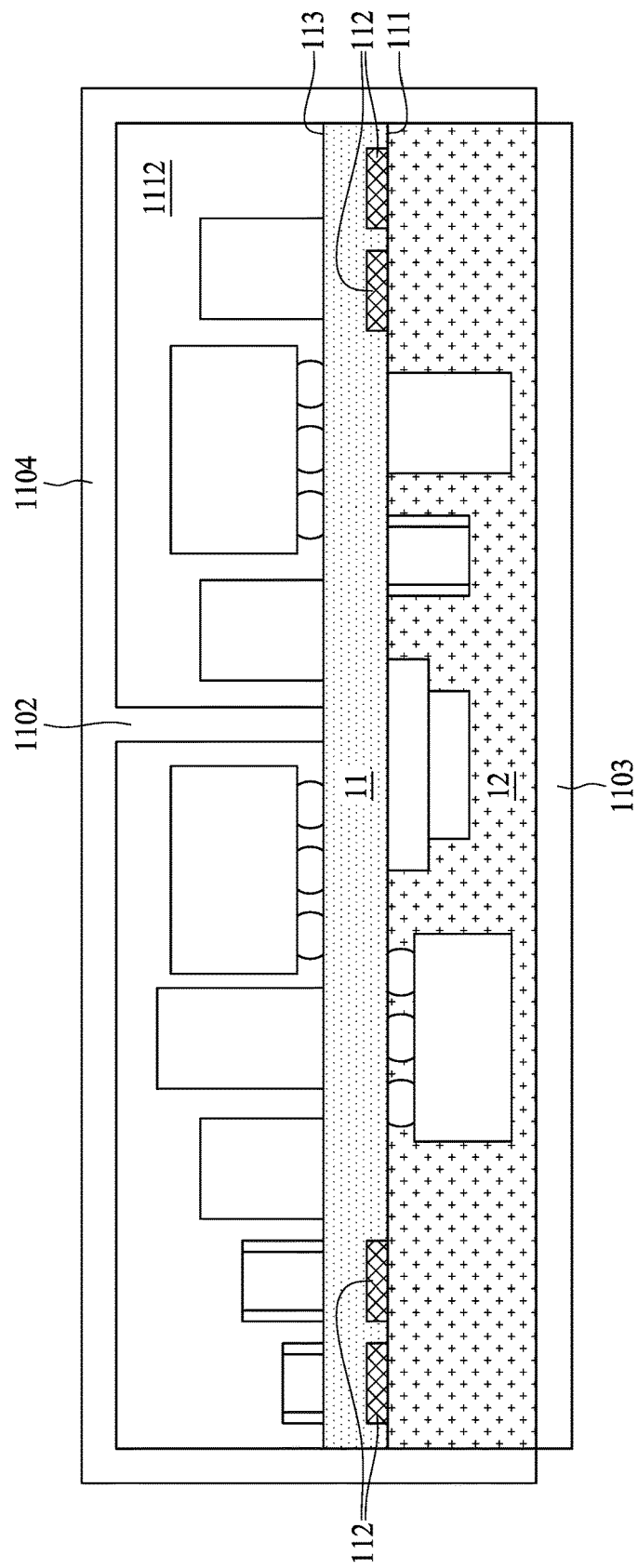

Referring to FIG. 11F, a conformal shield 1104 is formed to cover the package body 1112, side surfaces of the substrate 11 and side surfaces of the package body 12. The conformal shield 1104 is electrically connected to the compartment shield 1102.

Figure 11G:
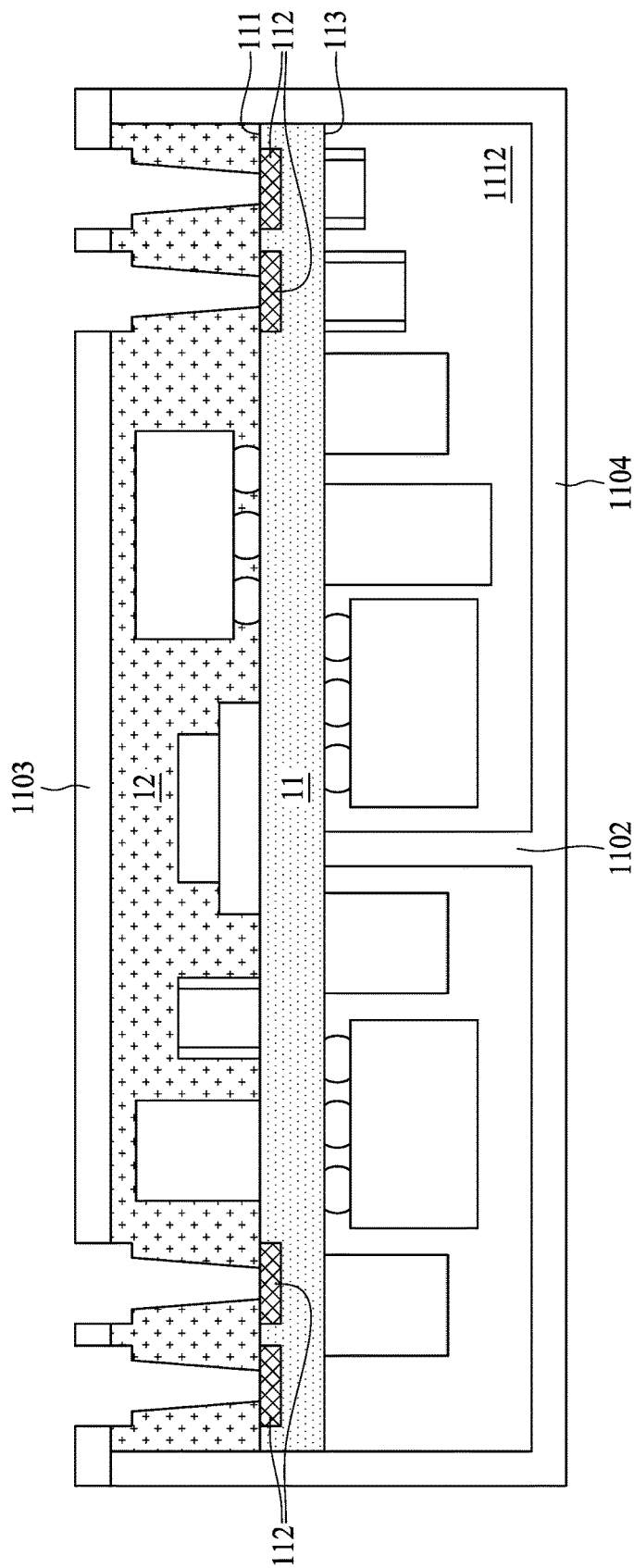

Referring to FIG. 11G, portions of the package body 12 and portions of the mask layer 1103 are removed by cutting, laser drilling, etching or other removal process to form via holes.

Figure 11H:
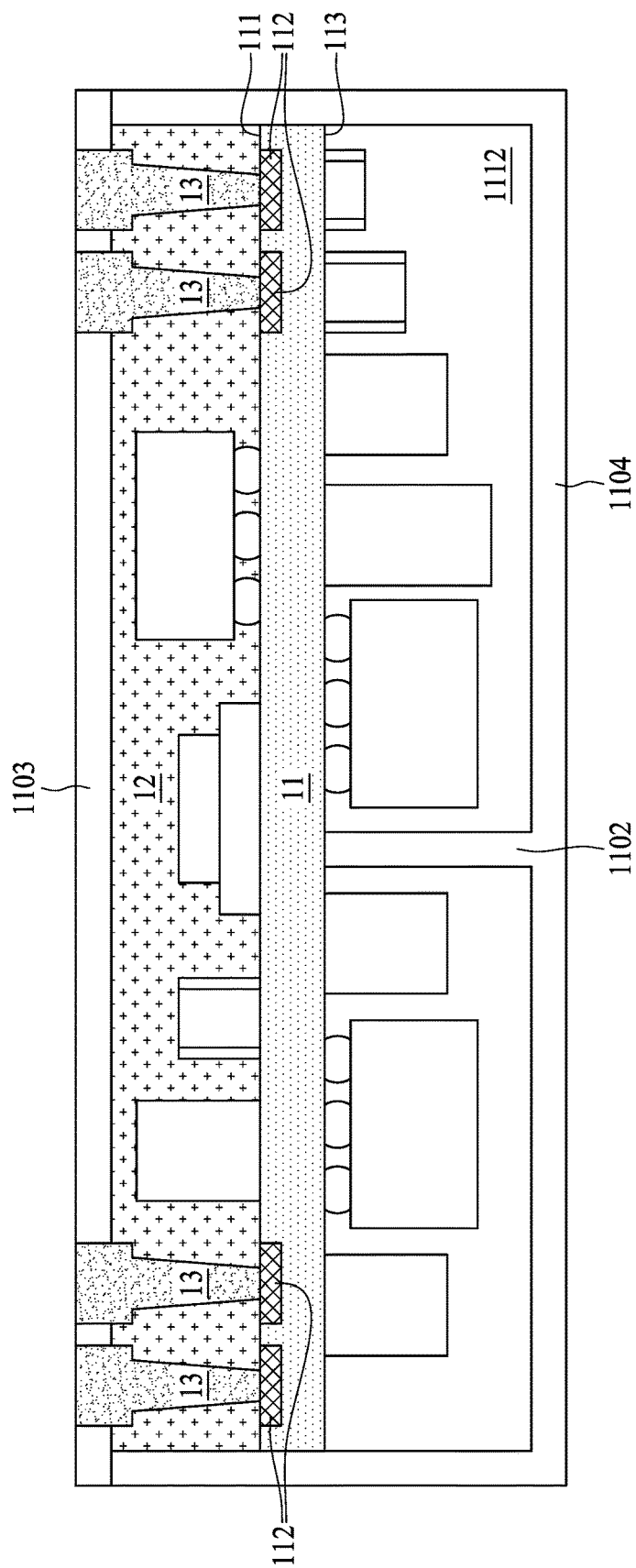

Referring to FIG. 11H, a conductive material is filled into the via holes of FIG. 11G to form a conductive layer 13 in each via hole.

Figure 11I:
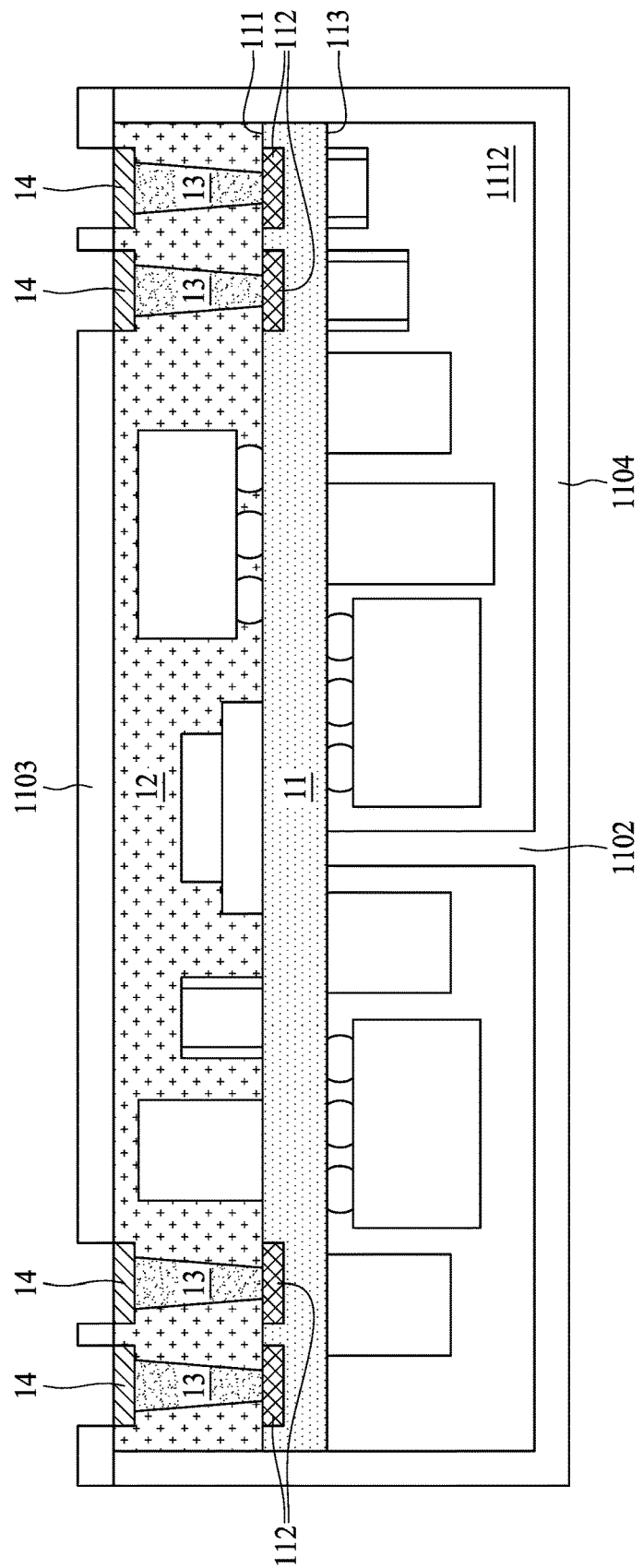

Referring to FIG. 11I, first intermediate layers 14 are formed on respective conductive layers 13.

Figure 11J:
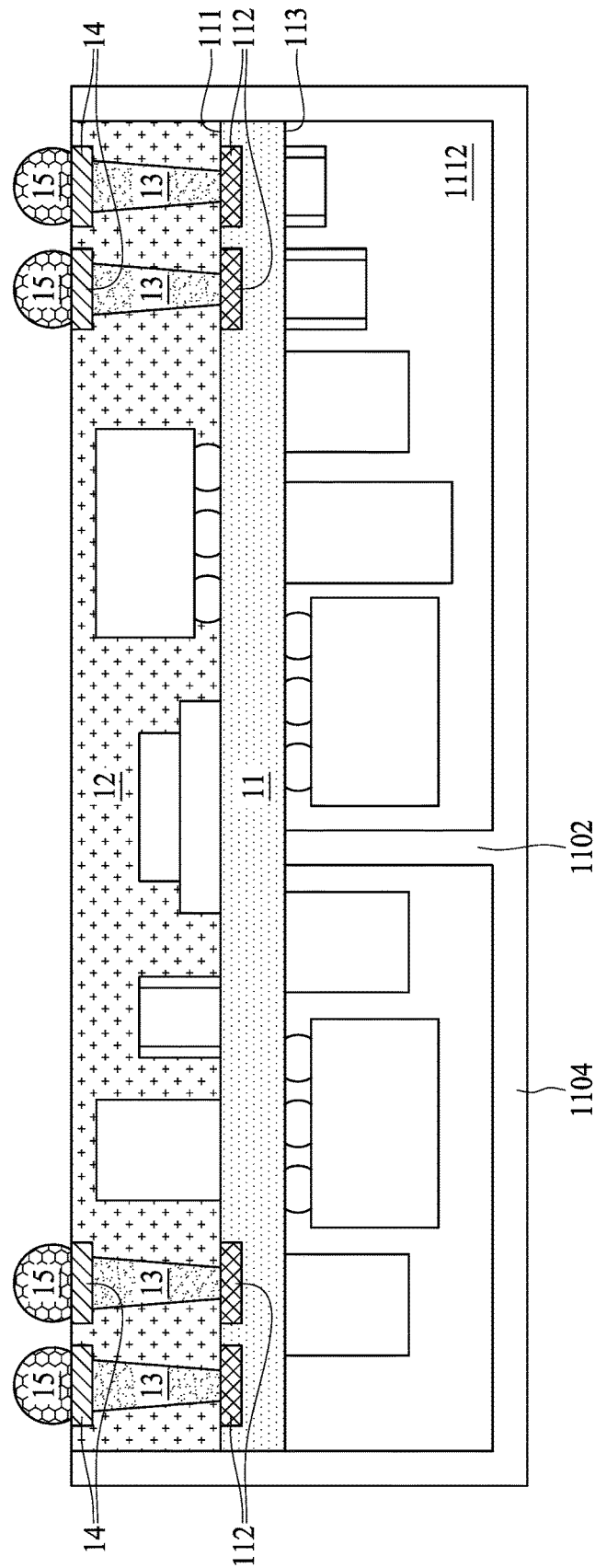

Referring to FIG. 11J, interconnects 15 are formed on respective first intermediate layers 14 and the mask layer 1103 is removed.

Figure 11K:
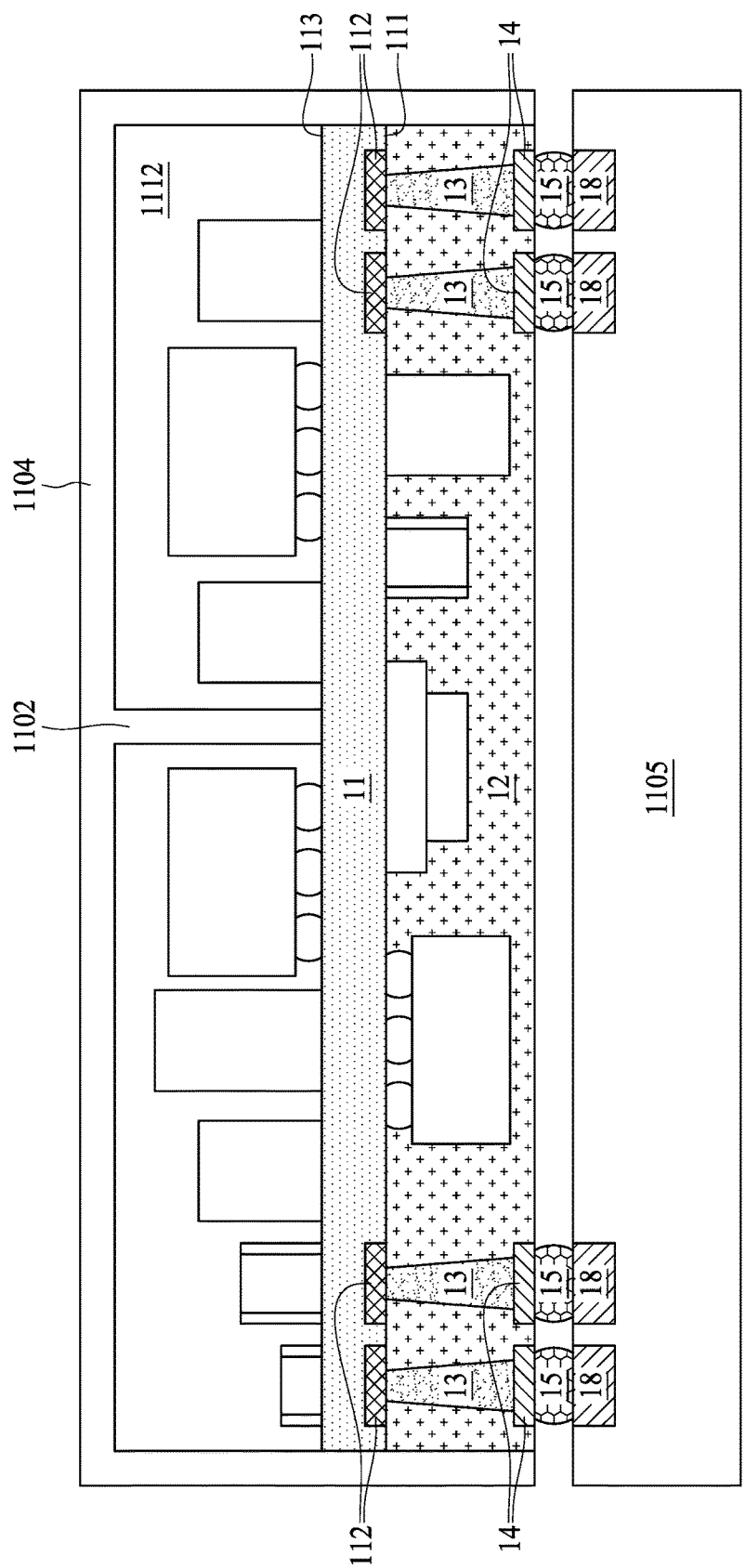

Referring to FIG. 11K, the interconnects 15 are used to electrically connect the pads 112 with pads 18 on another substrate 1105.

As used herein, the singular terms "a," "an," and "the" may include plural referents unless the context clearly dictates otherwise.

As used herein, the terms "connect," "connected," and "connection" refer to an operational coupling or linking. Connected components can be directly or indirectly coupled to one another, for example, through another set of components.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

As used herein, the terms "approximately," "substantially" "substantial," and "about" refer to a considerable degree or extent. When used in conjunction with an event or situation, the terms can refer to instances in which the event or situation occurs precisely as well as instances in which the event or situation occurs to a close approximation, such as when accounting for typical tolerance levels of the manufacturing methods described herein. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is understood that such range formats are used for convenience and brevity, and should be interpreted flexibly to include numerical values explicitly specified as limits of a range, as well as all individual numerical values or sub-ranges encompassed within that range, as if each numerical value and sub-range is explicitly specified.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims.

The construction and arrangement of the packages and methods as shown in the various example embodiments are illustrative only. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the example embodiments without departing from the scope of the present disclosure.

What is claimed is:

1. A semiconductor device package, comprising:
   a substrate comprising a dielectric material, a surface and a pad on the surface;
   a package body covering at least a portion of the surface of the substrate;
   a via disposed in the package body, the via comprising:
      a conductive layer electrically connected with the pad and comprising a first material; and
      a first intermediate layer adjacent to the conductive layer and comprising a second material; and
   an interconnect disposed on the first intermediate layer, wherein a melting temperature of the second material is higher than a melting temperature of the first material.

2. The semiconductor device package of claim 1, wherein a thickness of the first intermediate layer is less than one percent of a thickness of the conductive layer.

3. The semiconductor device package of claim 1, wherein the first intermediate layer comprises stainless steel.

4. The semiconductor device package of claim 1, wherein the interconnect comprises the first material.

5. The semiconductor device package of claim 4, wherein the first intermediate layer retains the conductive layer in the via.

6. The semiconductor device package of claim 4, further comprising a second intermediate layer between the first intermediate layer and the interconnect to bond the first intermediate layer to the interconnect.

7. The semiconductor device package of claim 6, wherein a first adhesion force between the second intermediate layer and the interconnect is larger than a second adhesion force between the first intermediate layer and the interconnect.

8. The semiconductor device package of claim 1, wherein the interconnect comprises a material different from the first material.

9. The semiconductor device package of claim 8, further comprising a second intermediate layer between the first intermediate layer and the interconnect to bond the first intermediate layer to the interconnect.

10. The semiconductor device package of claim 9, wherein a first adhesion force between the second intermediate layer and the interconnect is larger than a second adhesion force between the first intermediate layer and the interconnect.

11. The semiconductor device package of claim 1, wherein the melting temperature of the second material is larger than 260 degrees Celsius.

12. The semiconductor device package of claim 1, wherein the melting temperature of the second material is larger than a surface-mount reflow temperature.

13. The semiconductor device package of claim 1, wherein the package body defines a cavity aligned with the via, the first intermediate layer is disposed in the cavity and contacts the conductive layer.

14. The semiconductor device package of claim 1, wherein a first junction area between the first intermediate layer and the interconnect is larger than a second junction area between the first intermediate layer and the conductive layer.

15. The semiconductor device package of claim 6, wherein the second intermediate layer comprises stainless steel.

16. The semiconductor device package of claim 6, wherein a melting temperature of a material of the second intermediate layer is larger than 260 degrees Celsius.

17. The semiconductor device package of claim 6, wherein a melting temperature of a material of the second intermediate layer is larger than a surface-mount reflow temperature.

18. The semiconductor device package of claim 1, wherein the package body is a first package body, the surface of the substrate is a first surface, the substrate comprises a second surface opposite to the first surface of the substrate, and the semiconductor device package further comprises:
   a first electrical component disposed on the second surface of the substrate; and
   a second package body covering the first electrical component and the second surface of the substrate.

19. The semiconductor device package of claim 18, further comprising:
   a second electrical component disposed on the first surface of the substrate and at least partially covered by the first package body.

20. The semiconductor device package of claim 1, wherein the substrate includes at least one layer including a resin and impregnated fibers.

21. A semiconductor device package, comprising:
   a substrate comprising a surface and a pad on the surface;
   an electrical component disposed on the substrate;
   a package body covering at least a portion of the surface of the substrate;

a via disposed in the package body, the via comprising:
- a conductive layer electrically connected with the pad and comprising a first material; and
- a first intermediate layer adjacent to the conductive layer and comprising a second material; and an interconnect disposed on the first intermediate layer, wherein a portion of the interconnect is embedded in the package body, and a melting temperature of the second material is higher than a melting temperature of the first material.

22. The semiconductor device package of claim 21, wherein the pad comprises a surface facing the via, wherein an area of the surface of the pad is larger than a contact area between the pad and the conductive layer.

23. A semiconductor device package, comprising:
- a substrate comprising a surface and a pad on the surface;
- an electrical component disposed on the substrate;
- a package body covering at least a portion of the surface of the substrate and comprising a surface opposite to the surface of the substrate;
- a conductive via disposed in the package body, wherein the conductive via is electrically connected with the pad and penetrates through the package body and comprises a first material;
- a first intermediate layer protruding from the surface of the package body, wherein the first intermediate layer directly contacts with and is electrically connected with the conductive via and comprises a second material; and
- an interconnect disposed on the first intermediate layer, wherein a melting temperature of the second material is higher than a melting temperature of the first material.

24. The semiconductor device package of claim 23, further comprising a second intermediate layer between the first intermediate layer and the interconnect to bond the first intermediate layer to the interconnect.

25. The semiconductor device package of claim 23, wherein the conductive via does not protrude from the surface of the package body.

26. The semiconductor device package of claim 23, wherein the conductive via protrudes from the surface of the package body.

* * * * *